(12) United States Patent
Saarela et al.

(10) Patent No.: US 12,328,110 B2
(45) Date of Patent: Jun. 10, 2025

(54) MICROELECTROMECHANICAL SYSTEM RESONATOR ASSEMBLY

(71) Applicant: KYOCERA TECHNOLOGIES OY, Espoo (FI)

(72) Inventors: Ville Saarela, Espoo (FI); Antti Jaakkola, Espoo (FI); Aarne Oja, Espoo (FI)

(73) Assignee: KYOCERA TECHNOLOGIES OY, Espoo (FI)

( * ) Notice: Subject to any disclaimer, the term of this patent is extended or adjusted under 35 U.S.C. 154(b) by 371 days.

(21) Appl. No.: 17/918,389

(22) PCT Filed: Mar. 30, 2021

(86) PCT No.: PCT/FI2021/050229
§ 371 (c)(1),
(2) Date: Oct. 12, 2022

(87) PCT Pub. No.: WO2021/209682
PCT Pub. Date: Oct. 21, 2021

(65) Prior Publication Data
US 2023/0133733 A1 May 4, 2023

(30) Foreign Application Priority Data
Apr. 15, 2020 (FI) .................................. 20205386

(51) Int. Cl.
*H03H 9/24* (2006.01)
*H03H 9/02* (2006.01)

(52) U.S. Cl.
CPC ...... *H03H 9/2447* (2013.01); *H03H 9/02244* (2013.01); *H03H 2009/02291* (2013.01); *H03H 2009/0244* (2013.01)

(58) Field of Classification Search
CPC ........... H03H 9/02; H03H 9/24; G01C 19/02; G01C 19/56
See application file for complete search history.

(56) References Cited

U.S. PATENT DOCUMENTS

| | | | |
|---|---|---|---|
| 7,227,432 B2 * | 6/2007 | Lutz | H03H 9/02448 310/309 |
| 9,299,910 B1 | 3/2016 | Sparks et al. | |
| 9,315,376 B2 * | 4/2016 | Roland | G01C 19/5656 |
| 9,683,844 B2 * | 6/2017 | Seeger | G01C 19/56 |

(Continued)

OTHER PUBLICATIONS

Finnish Patent and Registration Office, Search Report, Application no. 20205386, Mailed Dec. 3, 2020, 2 pages.

(Continued)

*Primary Examiner* — Andrea Lindgren Baltzell
*Assistant Examiner* — Alan Wong
(74) *Attorney, Agent, or Firm* — Ziegler IP Law Group, LLC.

(57) ABSTRACT

A silicon microelectromechanical system, MEMS, resonator assembly, includes four flexural beam elements forming a rectangular frame, each beam element being connected at an end thereof to an end of a neighboring one of the beam elements. The resonator assembly further includes connection elements for connecting the rectangular frame to at least one mechanical anchor, and the resonator assembly supporting an in-plane flexural collective resonance mode.

16 Claims, 21 Drawing Sheets

(56) References Cited

U.S. PATENT DOCUMENTS

| | | | |
|---|---|---|---|
| 9,726,492 B2* | 8/2017 | Watanabe | G01C 19/5642 |
| 9,851,373 B2* | 12/2017 | Fujimoto | G01C 19/5684 |
| 9,927,239 B2* | 3/2018 | Hwang | G01C 19/5649 |
| 10,627,235 B2* | 4/2020 | Prikhodko | G01C 19/5747 |
| 10,775,168 B2* | 9/2020 | Mitani | H10N 30/302 |
| 11,561,097 B2* | 1/2023 | Blomqvist | G01C 19/5747 |
| 2007/0001783 A1 | 1/2007 | Lutz et al. | |
| 2011/0204999 A1 | 8/2011 | Le et al. | |
| 2011/0296914 A1 | 12/2011 | Takahashi et al. | |
| 2013/0277775 A1 | 10/2013 | Roland et al. | |
| 2014/0090470 A1 | 4/2014 | Fujimoto et al. | |
| 2016/0099703 A1 | 4/2016 | Jaakkola et al. | |
| 2019/0222196 A1 | 7/2019 | Daruwalla et al. | |
| 2019/0229701 A1 | 7/2019 | Li et al. | |
| 2019/0271544 A1 | 9/2019 | Soejima | |
| 2019/0346266 A1 | 11/2019 | Kuisma | |

OTHER PUBLICATIONS

Notification of Transmittal of the Interantional Search Report and the Written Opinion of the International Searching Authority, or the Declaration, Application No. PCT/FI2021/050229, Mailed Oct. 13, 2021, 27 pages.

Samarao et al, "Temperature compensation of silicon micromechanical resonators via degernate doping" IEEE International Electron Devices Meeting, DOI:10.1109/IEDM.2009.5424221, Dec. 2009, 4 pages.

Zou et al, "A novel tuneable band-pass filter bases on a single square-ring MEMS resonator", Procedia Engineering, pp. 1446-1449, XP027441081, ISSN: 1877-7058, DOI: 10.1016/J.PROENG.2010.09.388, 4 pages.

* cited by examiner

MICROELECTROMECHANICAL SYSTEM RESONATOR ASSEMBLY

FIELD

The aspects of the disclosed embodiments generally relate to microelectromechanical system, MEMS, resonators.

BACKGROUND

This section illustrates useful background information without admission of any technique described herein representative of the state of the art.

Low frequency clock references are conventionally obtained from quartz crystal oscillators, such as 32.768 kHz quartz crystal oscillators.

Microelectromechanical system, MEMS, resonators are being developed to provide the same functionality as quartz crystal oscillators with benefits such as reduced cost, smaller chip size, increased robustness against shock and vibrations, and better stability over a wide temperature range.

A key performance parameter in MEMS resonators such as silicon MEMS resonators used for frequency reference applications is the equivalent series resistance, ESR. ESR is inversely proportional to the quality factor Q of the resonator, and thus the maximization of this parameter is often desirable. Furthermore, another key performance parameter is the thermal stability of the resonance frequency.

SUMMARY

The aspects of the disclosed embodiments are directed to provide an optimized microelectromechanical resonator or at least to provide an alternative to existing technology.

According to a first example aspect of the disclosed embodiments there is provided a silicon microelectromechanical system, MEMS, resonator assembly, comprising:

four flexural beam elements forming a rectangular frame, each beam element being connected at an end thereof to an end of a neighboring one of the beam elements, the resonator assembly further comprising:

connection elements for connecting the rectangular frame to at least one mechanical anchor (or to the surroundings of the rectangular frame), and the resonator assembly supporting an in-plane flexural collective resonance mode.

The expression silicon MEMS resonator assembly herein means a resonator assembly that is based on single crystalline silicon rather than quartz. In certain embodiments, the silicon MEMS resonator assembly is mostly formed of single crystalline silicon (more than 50% of the mass).

In certain embodiments, the MEMS resonator assembly is fabricated on a silicon substrate or wafer. In certain embodiments, the MEMS resonator assembly is fabricated on a silicon-insulator-silicon substrate (or wafer, e.g., a silicon on insulator, SOI, wafer) which comprises a "device layer" of single crystalline silicon on top of a buried oxide layer. The buried oxide layer may reside on top of a silicon handle layer. In certain embodiments, the silicon handle layer is of polycrystalline silicon. In certain embodiments, the MEMS resonator assembly resides in the device layer. In certain embodiments, the device layer comprises a plurality of sub layers. In certain embodiments, the MEMS resonator assembly is fabricated on bonded SOI wafer with built-in sealed cavities on the handle wafer or on the buried oxide (i.e., C-SOI wafer).

In certain embodiments, the in-plane flexural collective resonance mode means a mode in which the mechanical vibration of the assembly occurs or predominantly occurs in the plane of the frame (or in the plane of the device layer, in contrast to out of plane vibrations). Accordingly, in the in-plane flexural collective resonance mode each of the flexural beam elements oscillate in the said plane.

In certain embodiments, each flexural beam element in the frame vibrates in antiphase with respect to its neighboring beam elements in the frame.

In certain embodiments, the neighboring flexural beam elements are connected to each other at a right angle.

In certain embodiments, all of the four flexural beam elements are identical. In certain embodiments, the frame is formed as a square.

In certain embodiments, the silicon MEMS resonator assembly further comprises coupling elements to mechanically couple adjacent beam elements. In certain embodiments, the coupling elements are to maintain a 90 degrees angle between said adjacent beam elements during vibration.

In certain embodiments, the said mechanical coupling is implemented at an inner corner side of corners formed by said adjacent beam elements. In certain embodiments, the coupling element mechanically connects to a first flexural beam element at a first distance from said corner and to a neighboring flexural beam element at a second distance from the said corner. In certain embodiments, the first and second distance are equal. In certain embodiments, there is a coupling element in each of the corners of the frame. In certain embodiments, each of the coupling elements are similar. In certain embodiments, the coupling elements are L-shaped elements. In certain embodiments, the coupling elements are angled beams. In certain embodiments, the coupling elements are angled beams with a 90 degrees angle. In certain embodiments, the coupling elements form an additional rectangular or square-shaped frame to each of the corners of the rectangular or square-shaped frame formed by the flexural beam elements.

Accordingly, in certain embodiments a silicon MEMS resonator assembly or structure with a rectangular frame provided with further rectangular frames in corners (or each of the corners) of the first mentioned frame is provided. In certain embodiments both the frame formed by the (four) flexural beam elements and the further frames at the (four) corners are squares.

In certain embodiments, the connection elements connect the rectangular frame to respective mechanical anchors. In certain embodiments, the said corners formed by said adjacent flexural beam elements form one end of suspension beams which connect the resonator assembly to mechanical anchors. In certain embodiments, the frame formed by the flexural beam elements is anchored to one or more mechanical anchors. In certain embodiments, the anchors are symmetrically placed with respect to the center of mass of the frame or the resonator assembly. In certain embodiments, the mechanical anchors reside on the outside of the said frame. In certain alternative embodiments, the mechanical anchors reside in the outside of the said frame. In certain embodiments, the resonator assembly comprises connection elements extending from suspension points (or from the frame) to respective mechanical anchors. In certain embodiments, the suspension points are located at corners of the rectangular frame. In certain embodiments, the resonator assembly is anchored or suspended at nodal points of oscillation.

In certain embodiments, the resonator assembly is suspended to the mechanical anchors from corners of the said frame by flexible suspension beams serving as the connection elements.

In certain embodiments, the connection elements are provided with additional spring elements. In certain embodiments, this is to increase the elasticity of corner suspensions.

In certain embodiments, each flexural beam element has an additional mass element on the inner side of the frame.

In certain embodiments, the additional mass elements are connected or attached (or fixed) to center points of the flexural beam elements.

In certain embodiments, the silicon MEMS resonator assembly comprises a meander spring element connecting a respective flexural beam element to its respective mass element. In certain embodiments, each flexural beam element is connected to its respective mass element by a meander spring element. In certain embodiments, each meander spring element is formed of elongated mass portions, aligned parallelly with one of the flexural beam elements of the said rectangular frame.

In certain embodiments, the said meander spring elements are connected at one end to a respective parallel flexural beam element and at the other end to a respective mass element.

In certain embodiments, the silicon MEMS resonator assembly comprises a central synchronizing element inside of the rectangular frame.

In certain embodiments, the central synchronizing element is of the shape of a star. In certain embodiments, the central synchronizing element is connected to said at least one mechanical anchor. In certain embodiments, the central synchronizing element is connected to the rectangular frame directly or via an intermediate element. In certain embodiments, the central synchronizing element is connected to a respective additional mass element. In certain embodiments, the central synchronizing element is of the shape of a cross. In certain embodiments, the central synchronizing element is connected via a diagonal beam to said at least one mechanical anchor or directly to the rectangular frame.

In certain embodiments, the central synchronizing element is a four-pointed star. In certain embodiments, the star is connected by its tips to the additional mass elements. In certain embodiments, the star is connected by additional diagonal beams to the mechanical anchors. In certain embodiments, the additional beams extend to respective mechanical anchors from spots where adjacent points of the star meet.

In certain embodiments, the silicon MEMS resonator assembly comprises a plurality of flexural beam resonators or flexural beam-mass resonators that outwardly protrude from the rectangular frame.

In certain embodiments, the beams of said outwardly protruding flexural beam resonators or flexural beam-mass resonators connect to the said frame at right angles.

In certain embodiments, said outwardly protruding flexural beam resonators are in the form of straight beams or angled beams. In certain embodiments, said outwardly protruding flexural beam-mass resonators are in the form of a straight beam provided with a mass element at its opposite end. Alternatively, said outwardly protruding flexural beam-mass resonators are in the form of an angled beam provided with a mass element at its opposite end.

In certain embodiments, there is variation in the width of adjacent flexural beam elements of the frame. In certain embodiments, said variation is uncontrollable variation caused by fabrication, e.g., manufacturing tolerances. In certain embodiments, said variation in intentional. In one such an embodiment, the rectangular frame has opposite short sides and opposite long sides, and the widths of the short sides of the rectangular frame are smaller than those of the long sides.

For example, in certain embodiments two opposite flexural beam elements have the same first beam width and the remaining two opposite flexural beam elements have the same second beam width, where the first beam width differs from the second beam width. In certain embodiments, each individual flexural beam element has an even width, i.e., the width within an individual flexural beam element does not vary.

In certain embodiments, each flexural beam element is aligned along a <100> crystalline direction of single crystalline silicon (in the device layer) or deviates at most 15 degrees from such a direction.

In certain embodiments, in case the resonator assembly has flexural beam (i.e., resonating) elements with their longitudinal axes in two different directions in the (silicon) device layer of the resonator, the resonating elements are aligned along two of the following crystalline directions [100], [010], and [001] of single crystalline silicon (in the device layer), or deviate at most 15 degrees from the direction in question.

In certain embodiments, in case the resonator assembly has flexural beam (i.e., resonating) elements with parallel longitudinal axis only, the resonating elements are aligned along one of the following crystalline directions [100], [010], and [001] of single crystalline silicon (in the device layer), or deviate at most 15 degrees from that direction.

In certain embodiments, the resonator assembly has reflection symmetry. In certain embodiments, the resonator assembly has mirror symmetry. In certain embodiments, the mirror symmetry is with respect to x-axis and/or y-axis. In certain embodiments, the intersection of the x-axis and y-axis is in the center of mass of the resonator assembly. In certain embodiments, the resonator assembly has rotational symmetry.

In certain embodiments, a first part of a flexural beam element resides in a degeneratively doped silicon layer and a second part of the flexural beam element resides in a $SiO_2$ layer formed beneath or above or on both sides of the degeneratively doped silicon layer.

In certain embodiments, the said $SiO_2$ layer is a layer in the said device layer.

In certain embodiments, the resonator assembly comprises:

a materials stack with a silicon oxide layer in between a top electrode layer and a bottom electrode layer.

In certain embodiments, the silicon MEMS resonator assembly comprises:

a piezoelectric layer for piezoelectric actuation of the collective resonance mode.

In certain embodiments, the silicon MEMS resonator assembly comprises a top electrode and a bottom electrode for the piezoelectric actuation.

In certain embodiments, there are separate top electrode and bottom electrode layers.

In certain embodiments, the silicon MEMS resonator assembly comprises two top electrodes for the piezoelectric actuation.

In certain embodiments, the resonator assembly comprises two top electrodes with opposite polarities and an electrically floating bottom electrode.

In certain embodiments, the silicon MEMS resonator assembly comprises a degeneratively doped single crystalline silicon body.

In certain embodiments, the said silicon body is comprised by the said device layer. In certain embodiments, the silicon body is doped to an average impurity concentration of at least $2*10^{19}$ cm$^{-3}$.

In certain embodiments, the silicon MEMS resonator assembly is configured to operate at 32 kHz frequency band, such as at the frequency 32.768 kHz.

According to a second example aspect of the disclosed embodiments there is provided use of the said frame of the first aspect to synchronize flexural beam or beam-mass resonators into a single collective resonance mode.

Different non-binding example aspects and embodiments have been presented in the foregoing. The above embodiments and embodiments described later in this description are used to explain selected aspects or steps that may be utilized in implementations of the present disclosure. It should be appreciated that corresponding embodiments apply to other example aspects as well. Any appropriate combinations of the embodiments can be formed.

BRIEF DESCRIPTION OF THE DRAWINGS

The disclosed embodiments will now be described, by way of example only, with reference to the accompanying drawings, in which.

DETAILED DESCRIPTION

In the following description, like numbers denote like elements.

Figure 1:
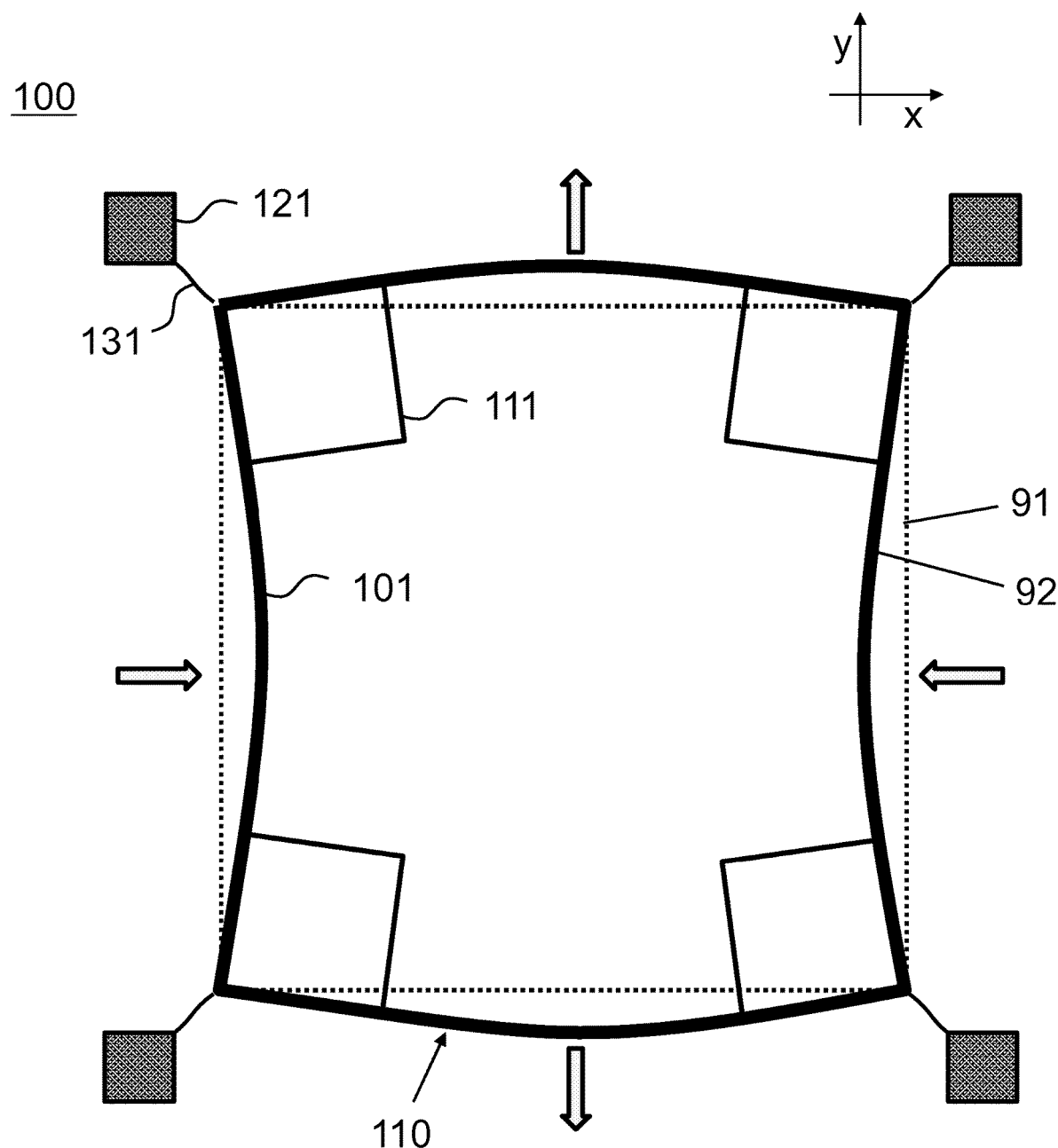
FIG. 1 shows a resonator assembly in accordance with certain embodiments.

FIG. 1 shows a resonator assembly 100 which consists of four flexural beam resonators (or elements) 101 which together form a square-shaped frame 110. Neighboring beam resonators 101 are connected to each other at one end at a right angle. In addition, the neighboring beam resonators are mechanically coupled to each other through square-frame-shaped coupling elements 111. The resonator assembly 100 resonates in a single collective resonance mode in which the motion of neighboring beams 101 is in antiphase with respect to each other. The purpose of the square-frame-shaped coupling elements 111 is to ensure that the beam assembly resonates in a single collective mode even in the presence of small variations of beam dimensions caused for example by manufacturing tolerances.

It is advantageous to design the coupling elements 111 so that they are rigid in comparison to the beams 101. Mathematically speaking, it is advantageous if the resonance frequencies of the bending modes of the coupling elements 111 are larger than the resonance mode of the flexural bending mode of the beam 101.

In preferred embodiments, the resonator assembly is mechanically anchored to a substrate at nodal points in the corners of the frame 110 using suspension beams. In FIG. 1, mechanical anchors 121 are placed outside the resonator assembly 100 in symmetrical positions with respect to the center point of the frame 110. The anchors 121 are connected to nodal points of the resonator assembly 100 by using flexible suspension beams (connection elements) 131 which allow the corners of the resonator assembly 100 to undergo a small angular motion about the nodal points (without translational movement) as the resonator vibrates. The resonator assembly in a rest shape is depicted by the dotted line marked by reference numeral 91, while the shape upon vibration is depicted by reference numeral 92 in FIG. 1.

In some embodiments, the suspension beams 131 at the four corners are so narrow, and therefore flexible, that the rigidity of the square-frame-shaped beam assembly is sufficient to synchronize the vibration of the beams 101 without use of the coupling elements 111. However, in some embodiments it is advantageous to increase the shock tolerance of the structure by using not-too-flexible suspension beams 131 and to ensure synchronized vibration of the square-frame-shaped beam resonator assembly 100 by using coupling elements.

Figure 2:
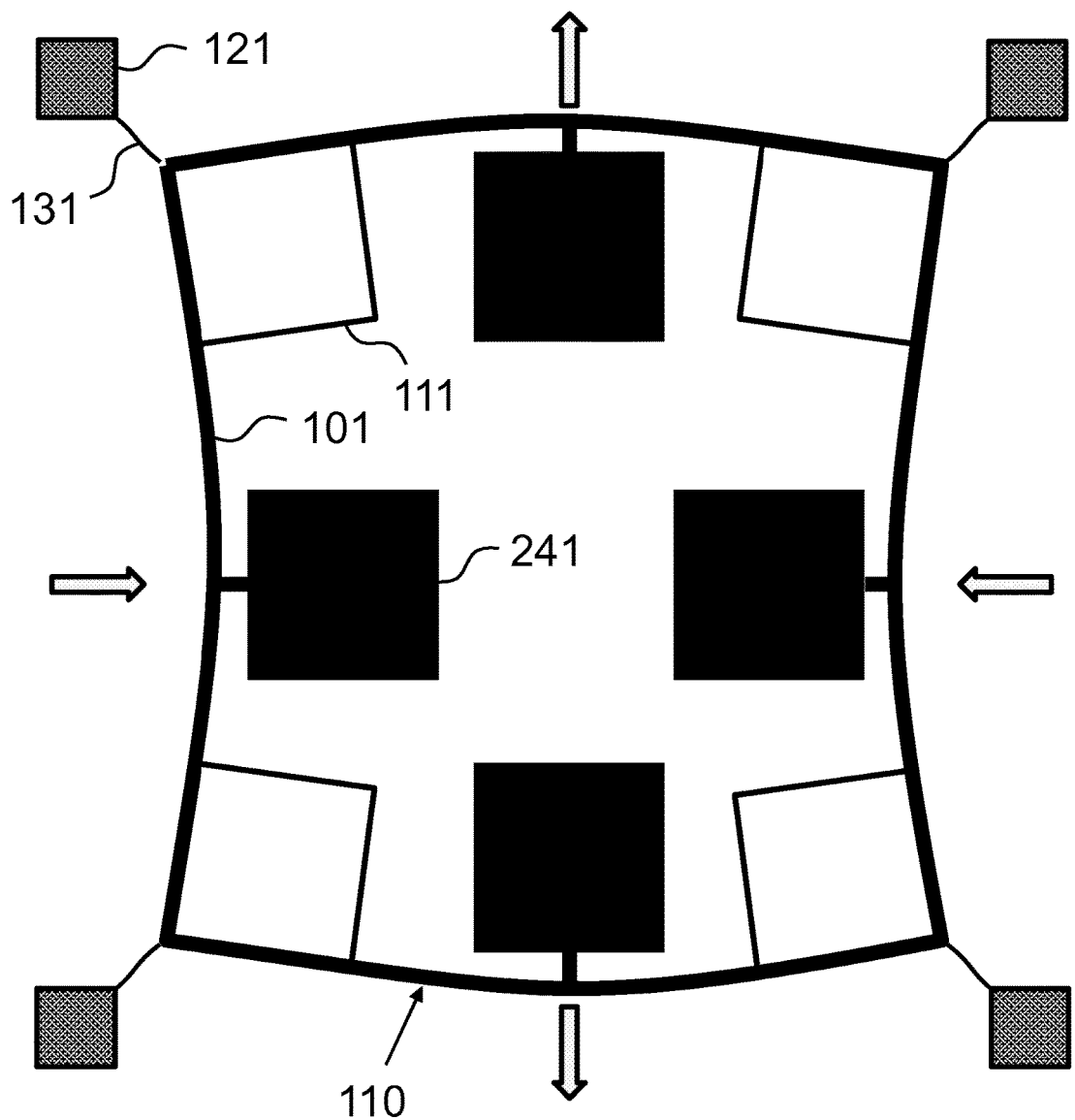
FIG. 2 shows a resonator assembly with additional mass elements in accordance with certain embodiments.

The resonance frequency of the resonator assembly is determined by the geometry, dimensions, and materials properties. Use of additional mass elements gives additional degrees of freedom to the design of the resonator. FIG. 2 shows a resonator assembly 200 in which mass elements 241 attached to the center points of the vibrating beams 101 are used to lower the resonance frequency. Otherwise the resonator assembly 200 corresponds to the resonator assembly 100.

In other embodiments, there are mass elements fixed to other positions of the resonator assembly (not shown in FIG. 2). It is advantageous to maintain the symmetry of the resonator design with respect to the center point of the frame to maximize the quality factor of the resonator.

Figure 3:
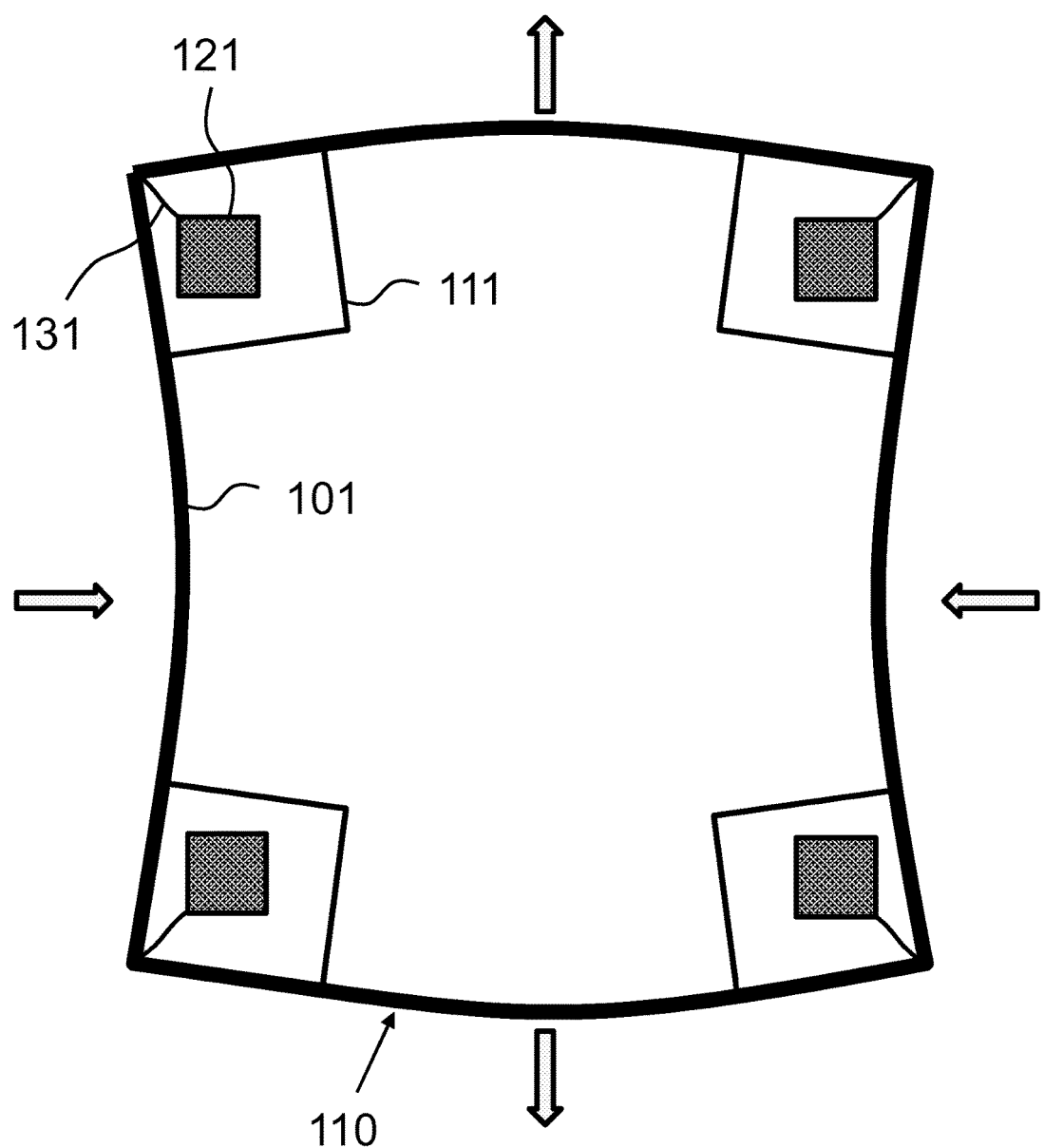
FIG. 3 shows a further modification of the resonator assembly of FIG. 1.

In other embodiments, such as in the resonator assembly 300 shown in FIG. 3, the mechanical anchoring points are moved inside the resonator. Otherwise the resonator assembly 300 corresponds to the resonator assembly 100.

In some embodiments, the rigidity of the square-frame-shaped beam assembly is sufficient to synchronize the vibration of the beams 101 without the use of the coupling elements 111 and the suspension beams 131 extending from the four corners are all connected at their opposite ends to the same central anchoring area (not shown in FIG. 3) at the center of the square-frame-shaped resonator assembly 300.

Figure 4:
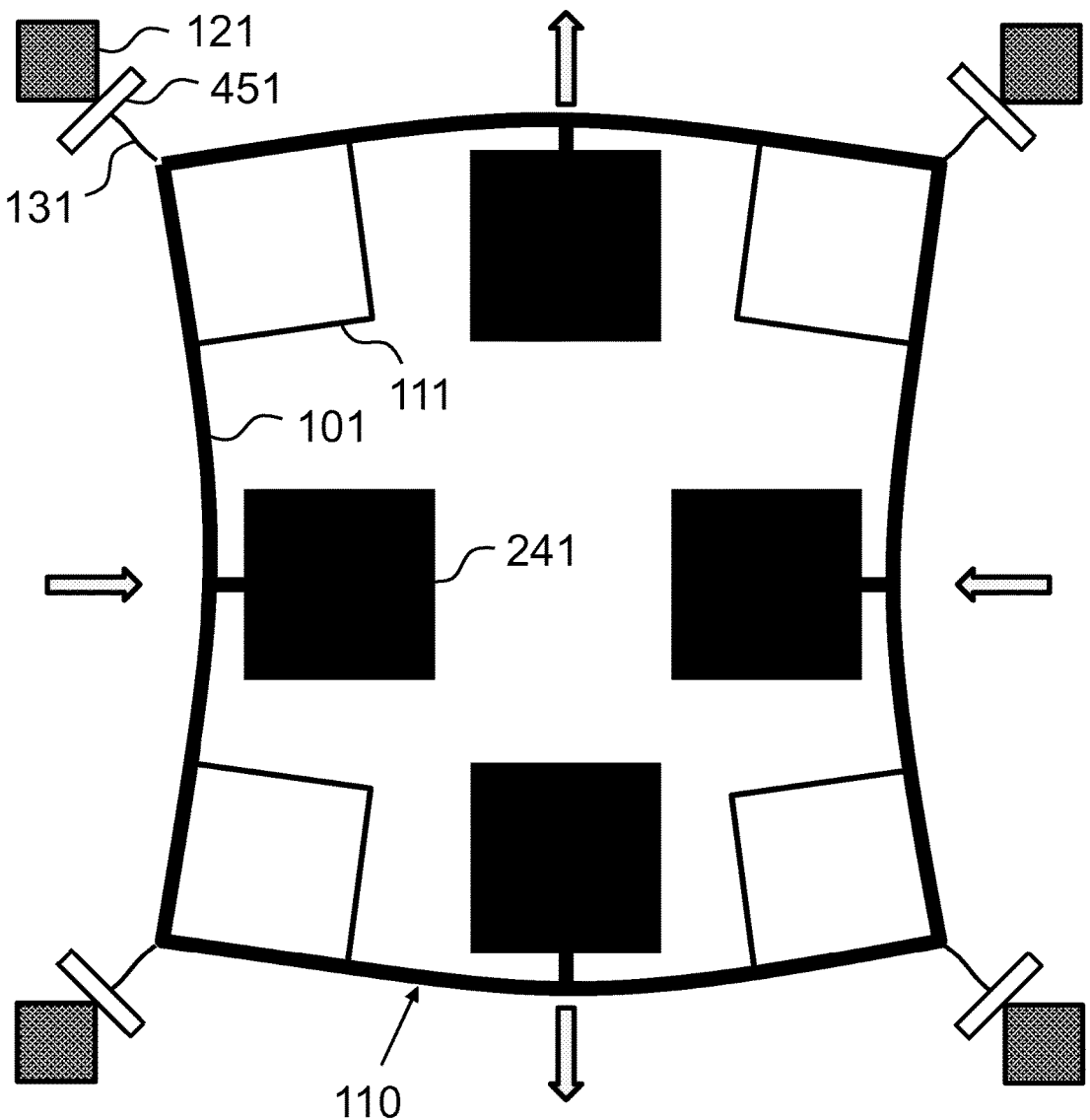
FIG. 4 shows a resonator assembly in accordance with certain further embodiments.

In other embodiments, there are separate stress release structures which are part of the suspension elements 131 which connect the nodal points to the mechanical anchors 121 as shown in FIG. 4. Accordingly, as shown in the resonator assembly 400 of FIG. 4, the connection elements 131 are provided with additional spring elements 451 to increase the elasticity of corner suspensions. Otherwise the resonator assembly 400 corresponds to the resonator assembly 200.

Figure 5:
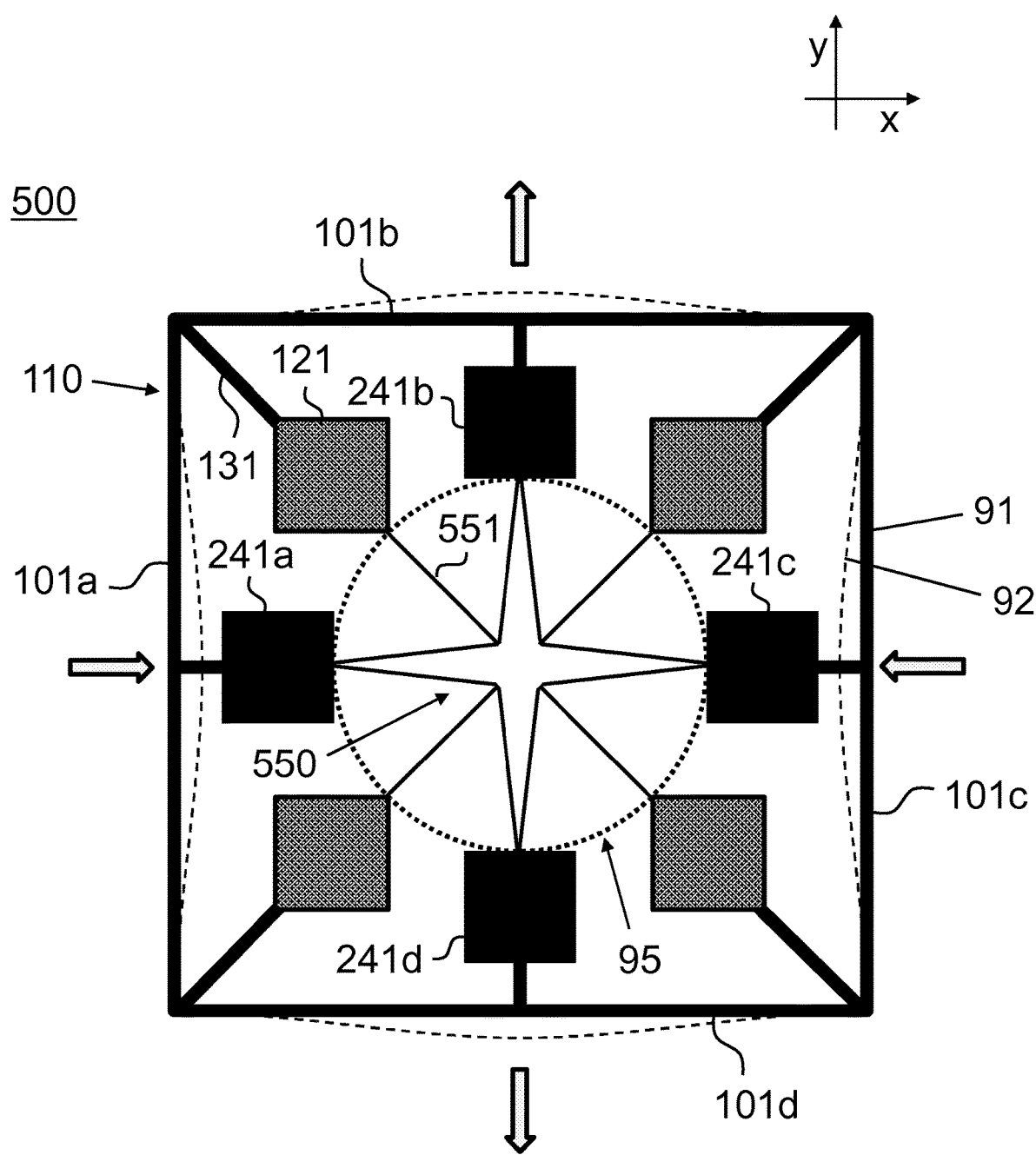
FIG. 5 shows a resonator assembly with a star-shaped synchronization structure in accordance with certain embodiments.

FIG. 5 shows a resonator assembly 500 in which the four flexural beams 101 (here: 101a-101d) resonate in a similar collective mode as discussed in the preceding examples but with the difference that the synchronization is ensured by a suspended beam structure 550 in the center of the resonator assembly 500. The synchronizing structure 550 has the shape of a star (here: four-pointed star) armed with four additional diagonal beams 551. The star 550 is connected by its tips to respective additional mass elements 241a-241d attached to the respective beam elements 101a-101d. In certain embodiments, the star 550 is connected by the additional diagonal beams 551 to respective mechanical anchors 121. In certain embodiments, the additional beams 551 extend to respective mechanical anchors 121 from spots where adjacent points of the star 550 meet. The structure 550 has the effect that the mass elements 101a and 101c move towards the center the mass when the mass elements 101b and 101d are pushed away from the center. The reference numeral 95 depicts a circular guide for eye only.

Figure 6A:
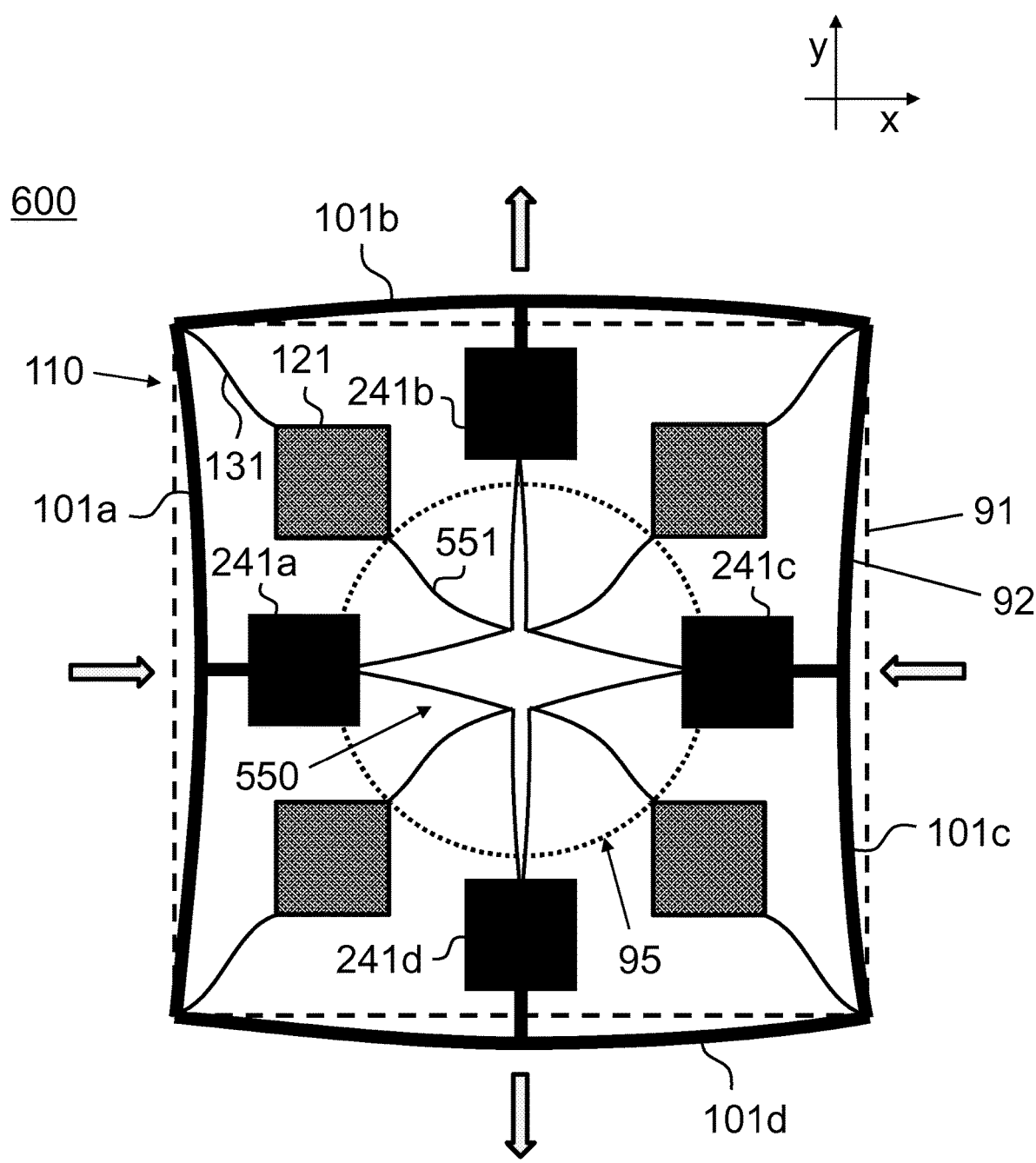
FIG. 6A shows a modification to the resonator assembly of FIG. 5 under vibration.

In the resonator shown in FIG. 5, the nodal points (i.e., the corners of the frame 110) are fixed using rigid suspension beams 131 extending from the nodal points to respective anchors 121 so that the nodal points do not experience rotational movement (nor translational movement) when the beams 101a-101d are vibrating. In some embodiments, it is preferable to use flexible suspension beams 131 instead, as shown in FIG. 6A. The corners of the resonator assembly 600 (or frame 110) undergo a small angular motion about the nodal points (without translational movement) as the resonator assembly vibrates. The movements of the masses 241a-241d and beams 101a-101d are exaggerated for an illustrative purpose. Use of flexible suspension beams tends to reduce the resonance frequency of the resonator assembly which makes it possible to make low-frequency resonators using smaller die area.

Another advantage of using the central synchronization structure 550 as a connecting element for the orthogonal flexural resonators 101a-101d is that the susceptibility of resonators 101a-101d to linear acceleration in the xy-plane is reduced as the structure 550 opposes a linear motion of the proof masses (or mass elements 241a-241d) in the xy-plane.

Figure 6B:
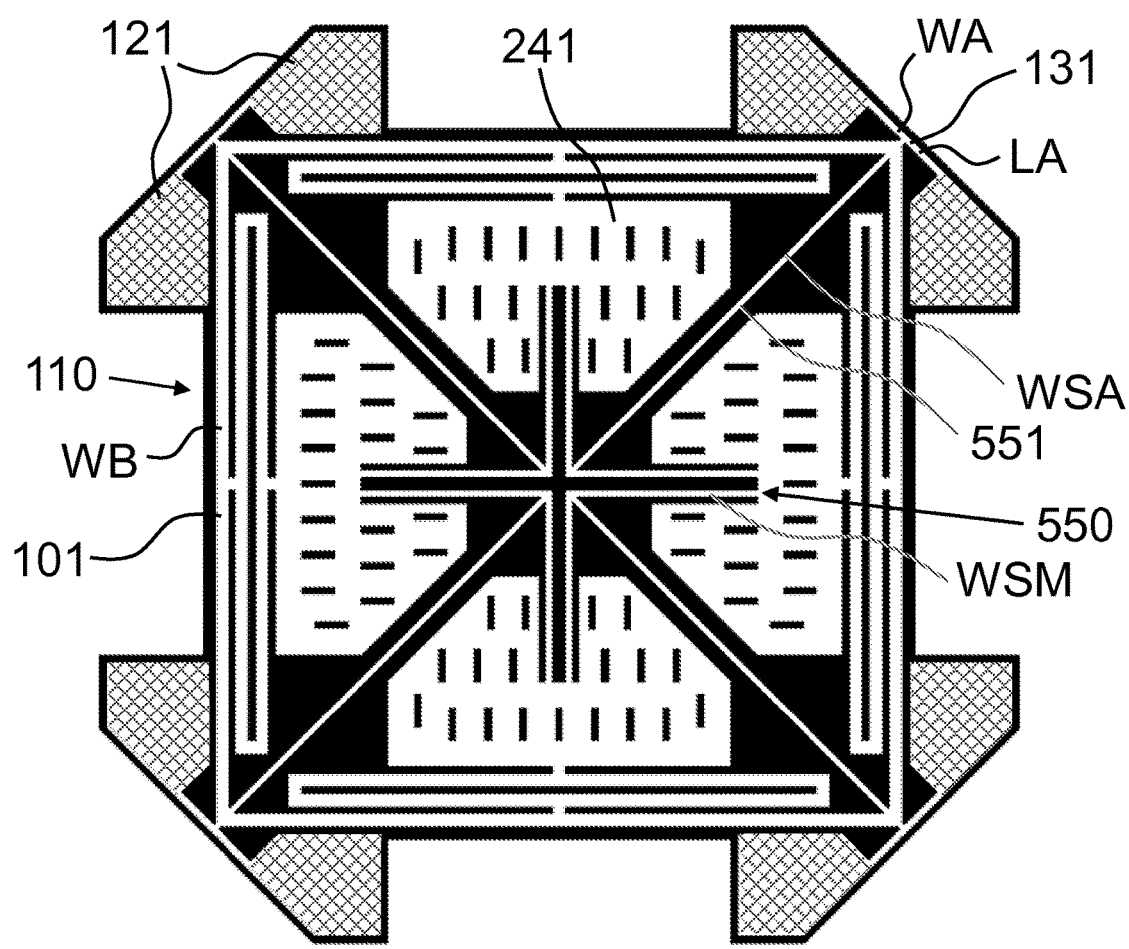
FIG. 6B shows a modification to the resonator assembly of FIG. 6A.

FIG. 6B illustrates a yet further embodiment of a resonator assembly with a central synchronizing element. In the shown resonator assembly 650 the outer dimensions of the rectangular frame 110 are 520 μm×520 μm. The widths of the flexural beams 101 are WB=10 μm. The rectangular frame is provided with additional meander-shaped springs of the width WB=10 μm, connected at one end to the inner central edge of the respective rectangular frame beam element 101 and at the other end to the respective mass element 241. The meander shaped springs can be used to reduce the resonance frequency of the resonator assembly. The nodal points at the four corners are suspended with connection beams 131 to the respective mechanical anchors 121. The length of the suspension beam 131 is LA =35 μm and the width is WA=5 μm. The central synchronizing element 550 (which in the embodiment shown in FIG. 6B takes a form of a cross) is connected to each mass element 241 by two beams of width WSM=5 μm. The neighboring orthogonally aligned beams (of the synchronizing element), which are connected to the respective neighboring mass elements (of the same shape except for the 90 degrees rotation), are connected together at their central ends at which points they are also connected to the diagonal beams 551 of the width WSA=5 μm. The other ends of the diagonal beams are connected to the nodal points at the corners of the frame which are further connected to the mechanical anchors. Piezoelectrically coupled MEMS resonators with the above mentioned dimensions were fabricated with a Si/AlN/Al materials stack (with the cross section according to FIG. 11). The mass elements 241 were provided with a grid of small trenches to enable release of a buried oxide layer when the device is fabricated on a SOI (silicon-on-insulator) wafer. The measured resonance frequency was 53 kHz with the quality factor Q=30,000.

Figure 7:
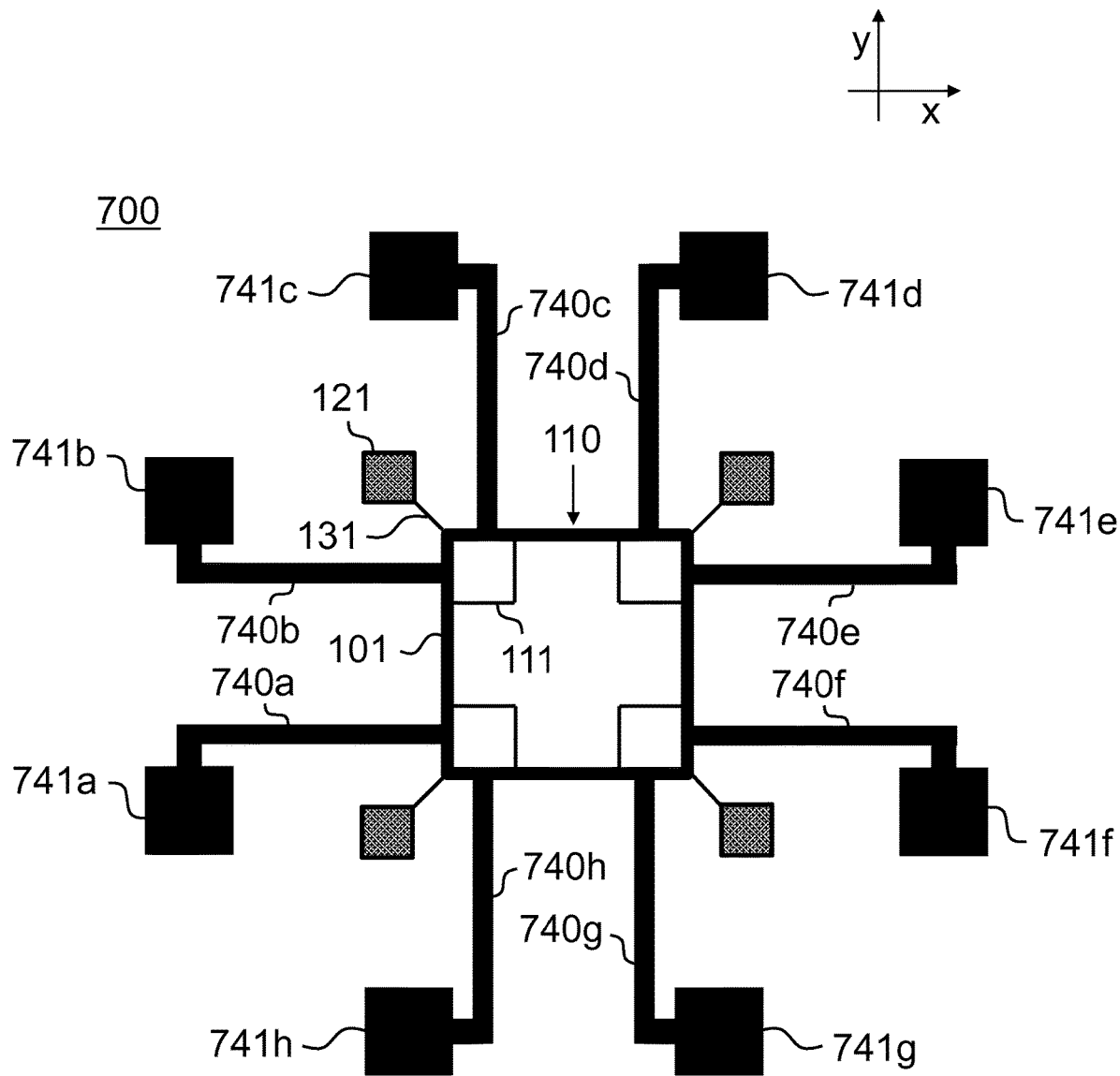
FIG. 7 shows a resonator assembly with beam-mass resonators in accordance with certain embodiments.
Figure 8:
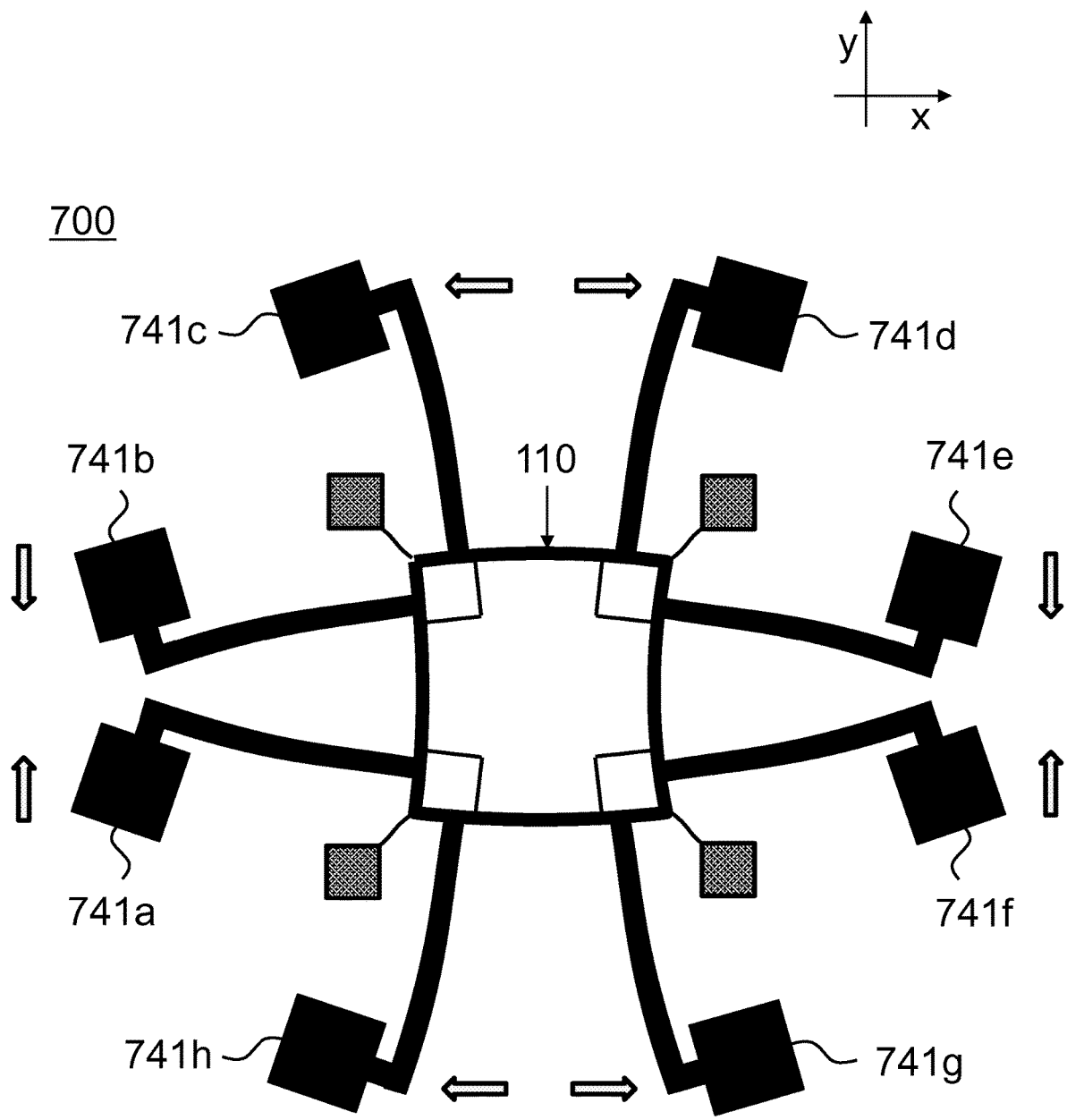
FIG. 8 shows the resonator assembly of FIG. 7 under vibration.

FIGS. 7 and 8 show another embodiment of the disclosed embodiments in which the square-shaped frame 110 comprising laterally bending beams 101 is used to synchronize the flexural resonance modes of beam-mass resonators into a single collective mode.

The resonator assembly 700 comprises the frame 110 with the coupling elements 111 in the corners of the frame 110 as shown in the preceding. The corners of the frame 110 are anchored by the flexible suspension beams 131 to respective mechanical anchors 121. Each beam-mass resonator is formed of a flexural beam element (elements 740a-740h in FIG. 7) that protrudes perpendicularly outwards from the frame 110 and is provided with a mass element (elements 741a-741h) at its opposite end. Depending on the embodiment the flexural beam elements 740a-740h may be in the form of straight or angled beams. The corners of the resonator assembly 700 (or frame 110) undergo a small angular motion about the nodal points (without translational movement) as the resonator assembly vibrates. Under vibration, as shown in FIG. 8, each adjacent outwardly protruding beam elements that protrude from a single beam element of the frame 110 (such as beam elements 740a and 740b) vibrate in antiphase.

In this example, the central square-shaped synchronizing element (or frame 110) is relatively rigid and its resonance frequency is higher than the resonance frequencies of the beam-mass resonators that protrude outwardly from the frame 110. The function of the synchronizing frame 110 differs in this respect from the embodiments shown in FIGS. 1-4 in which the beams forming the frame experience a large vibration amplitude.

In some embodiments, the central frame 110 alone is sufficient to synchronize the flexural beams 740a-740h into a collective motion and the coupling elements 111 in the corners of the central frame can be omitted.

In some embodiments, it is advantageous to add additional suspension elements to the mass portions (or elements) 741a-741h in order to increase the rigidity of the resonator structure against g-forces in the (out-of-plane) z-direction. This can be done for example by connecting meander-shaped spring elements (not shown) between the mass portions 741a-741h and surrounding areas mechanically anchored to the substrate. The dimensions of the meander-shaped spring elements are such that their effect on the spring constant for the vibrating flexural beams 740a-740h is small such as less than 10%.

In the resonator assemblies, the size of the mass elements in the preceding illustrations can vary across a wide range of values. In some embodiments, it is advantageous to reduce the value of the mass elements to the minimum (zero).

Figure 9:
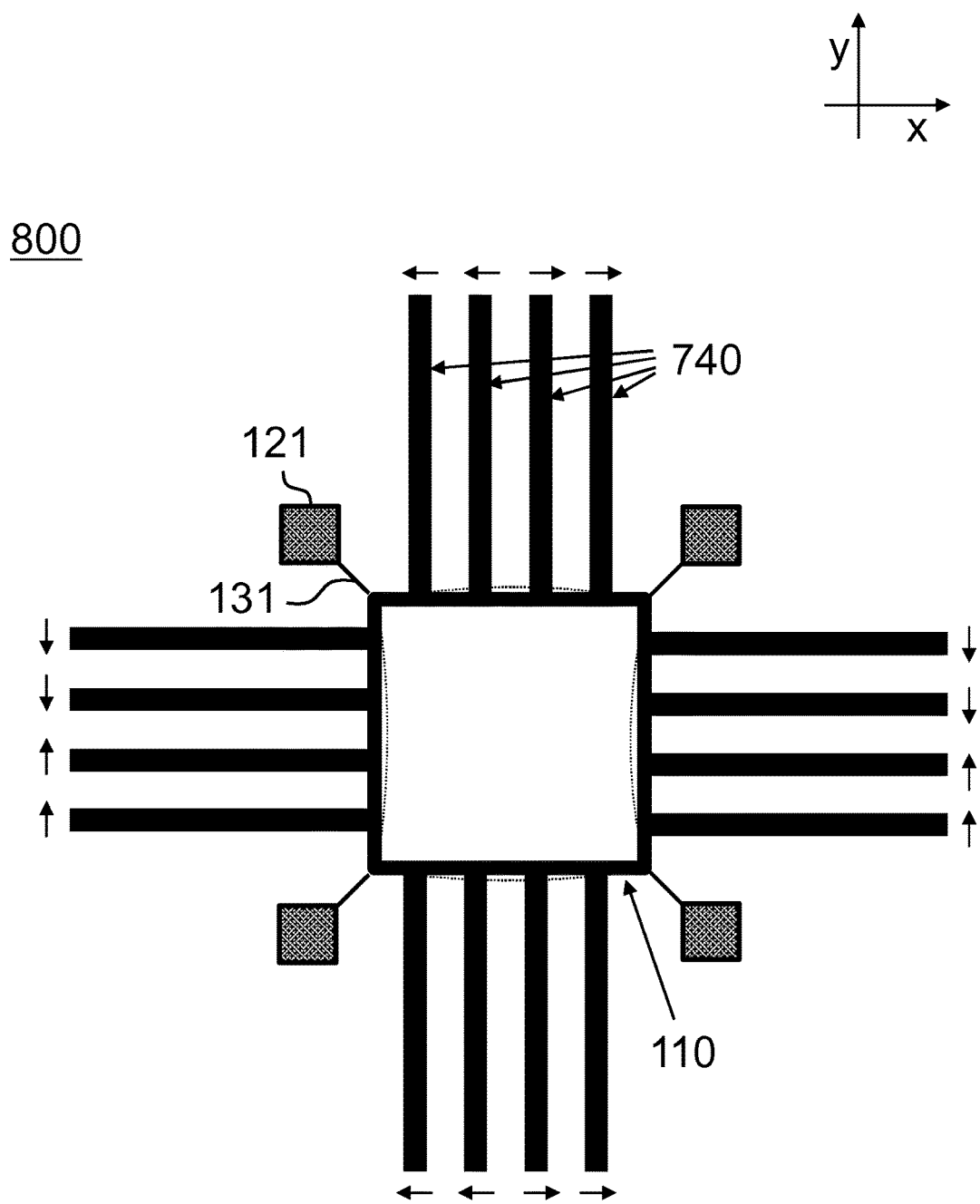
FIG. 9 shows a resonator assembly with flexural beam resonators in accordance with certain embodiments.

To further illustrate the above points, FIG. 9 shows a resonator assembly 800 in which the central frame 110 synchronizes 16 flexural beam resonators 740 into a single collective resonance mode. The small bending of the central frame 110, illustrated (and exaggerated) by the dotted line, ensures that beams 740 resonate either in phase or in antiphase with respect to each other as illustrated by the small arrows in FIG. 9.

Figure 10:
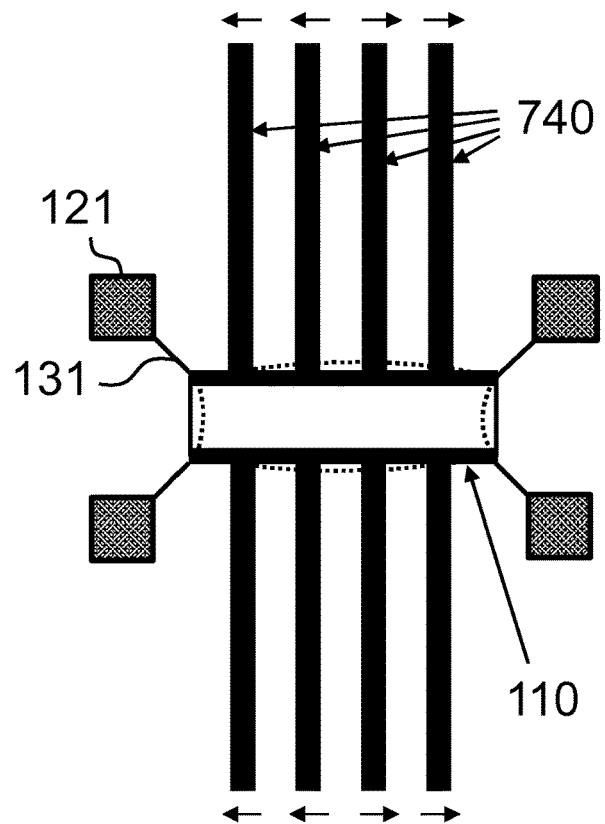
FIG. 10 shows a resonator assembly in accordance with certain further embodiments.

FIG. 10 shows a resonator assembly 900 which contains beam resonators 740 which are all parallel to each other. In this case, it is advantageous to use a non-square rectangular synchronizing element or frame 110 to save die area. The widths of the short sides of the synchronizing element 110 are smaller than those of the long sides.

The resonator assemblies 100-900 illustrated by the preceding embodiments are symmetric with respect to a central x-axis and/or y-axes. Accordingly, there is no movement or torque with respect to these symmetry lines.

The illustrated resonator assemblies are silicon MEMS resonator assemblies. The expression silicon MEMS resonator assembly herein means a resonator assembly that is based on single crystalline silicon rather than quartz. In certain embodiments, the silicon MEMS resonator assembly is mostly formed of single crystalline silicon (i.e., more than 50% of the mass of the resonator assembly is of single crystalline silicon).

In certain embodiments, the MEMS resonator assembly is fabricated on a silicon substrate or wafer. In certain embodiments, the MEMS resonator assembly is fabricated on a silicon-insulator-silicon substrate (or wafer, e.g., a silicon on insulator, SOI, wafer) which comprises a "device layer" of single crystalline silicon on top of a buried oxide layer. The buried oxide layer may reside on top of a silicon handle layer. In certain embodiments, the silicon handle layer is of polycrystalline silicon. In certain embodiments, the MEMS resonator assembly is fabricated on bonded SOI wafer with built-in sealed cavities on the handle wafer or on the buried oxide (i.e., C-SOI wafer). In certain embodiments, the MEMS resonator assembly resides in the device layer. In certain embodiments, the device layer comprises a plurality of sub layers (as shown later with reference to FIGS. 11, 13, and 18-20).

The illustrated silicon MEMS resonator assemblies resonate in an in-plane flexural collective resonance mode. The in-plane flexural collective resonance mode herein means a mode in which the mechanical vibration of the assembly occurs or predominantly occurs in the plane of the formed frame 110, i.e., in the xy-plane (or in the plane of the device layer, in contrast to out of plane vibrations). Accordingly, in the in-plane flexural collective resonance mode each of the flexural beam elements 101 (101 and 740 is some embodiments) oscillate in the said plane.

Figure 11:
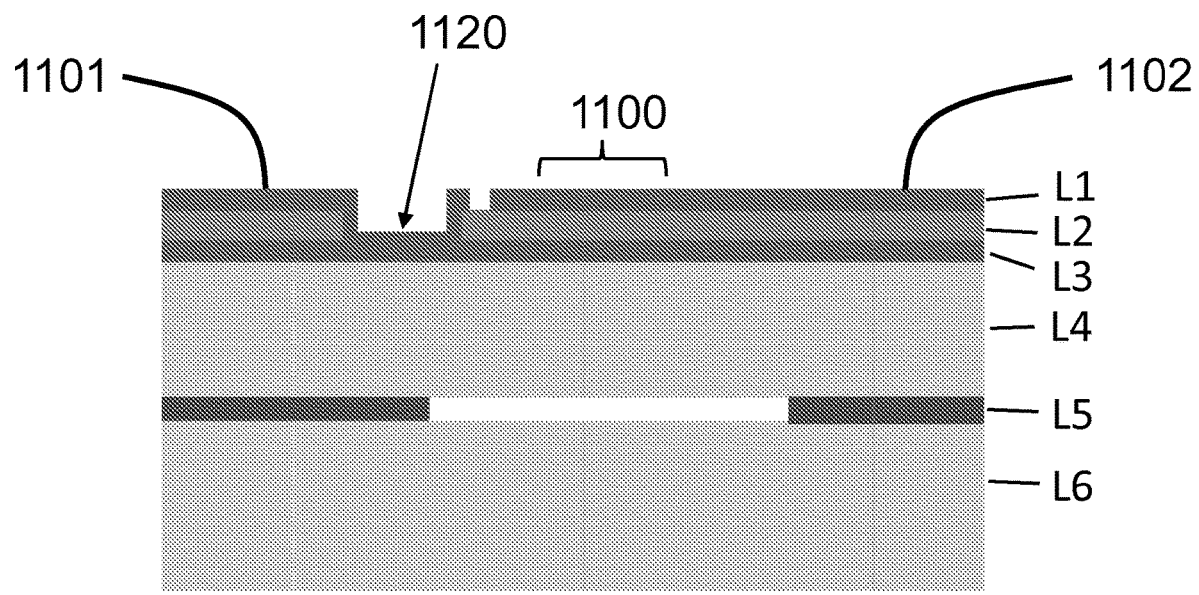
FIG. 11 shows a sectional view of a materials stack of a resonator assembly in accordance with certain embodiments.

FIG. 11 shows an example cross section of a resonator assembly when fabricated on a SOI wafer. Layers L1-L6 are shown in the drawing with following explanations:

L2=piezoelectric layer: Transduction (actuation of the mechanical vibrations) is based on the piezoelectric layer. Example layer materials are AlN, ScAlN, and ZnO. L2 thickness can be 1 µm, for example.

L1=top electrode layer: On the top side of the piezoelectric layer is a top electrode layer. The material of this layer may be Al, Mo, Au, polysilicon or any other suitable material that is electrically conductive. L1 thickness can be in the range 100 nm . . . 500 nm, for example.

L3=bottom electrode layer: On the bottom side of the piezoelectric layer is a bottom electrode layer. The material of this layer may be Al, Mo, Au, polysilicon or any other suitable material that is electrically conductive. L3 thickness can be in the range 100 nm . . . 500 nm, for example.

L4=doped silicon layer (resonator body and bottom electrode): Phosphorus doped single crystal silicon forms >50% of the mass of the resonator assembly. In certain embodiments, the phosphorus doping concentration is more than $1*10^{19}$ cm$^{-3}$. It is possible that the doped silicon layer acts as the bottom electrode layer, i.e., layers L3 and L4 may be combined into a single layer of silicon. L4 thickness can be in the range of 2 µm-20 µm, for example. If doped silicon layer is not used as the bottom electrode layer, there may be thin seed layers between L4 and L3, such as layers of Ti, W, or Cr, to facilitate growth and adhesion of the bottom electrode material, and to prevent diffusion between L4 and L3.

L5=buried oxide layer: This layer (of SiO$_2$) is etched from underneath the resonator structure in order to release the resonator (the resonator area marked by reference sign 1100) to vibrate in its resonance mode.

L6=silicon handle layer.

In further embodiments, additional material layers may exist. Layers on top of the layer L6 and L5 form the said device layer.

The reference numeral 1101 indicates the electrical connection to the bottom electrode layer and reference numeral 1102 indicates the electrical connection to the top electrode layer. An opening in layer L2 is denoted by reference numeral 1120.

The thermal coefficient of the resonance frequency is the same for flexural beam resonators made of single crystalline silicon when the beams are orthogonal (or parallel) to each other. To minimize the linear temperature coefficient of the resonators, the longitudinal axes of the flexural resonating beams in certain embodiments are oriented along the <100>crystalline axes, or at an angle less than ±15 degrees with respect to a <100>crystalline axis.

Figure 12:
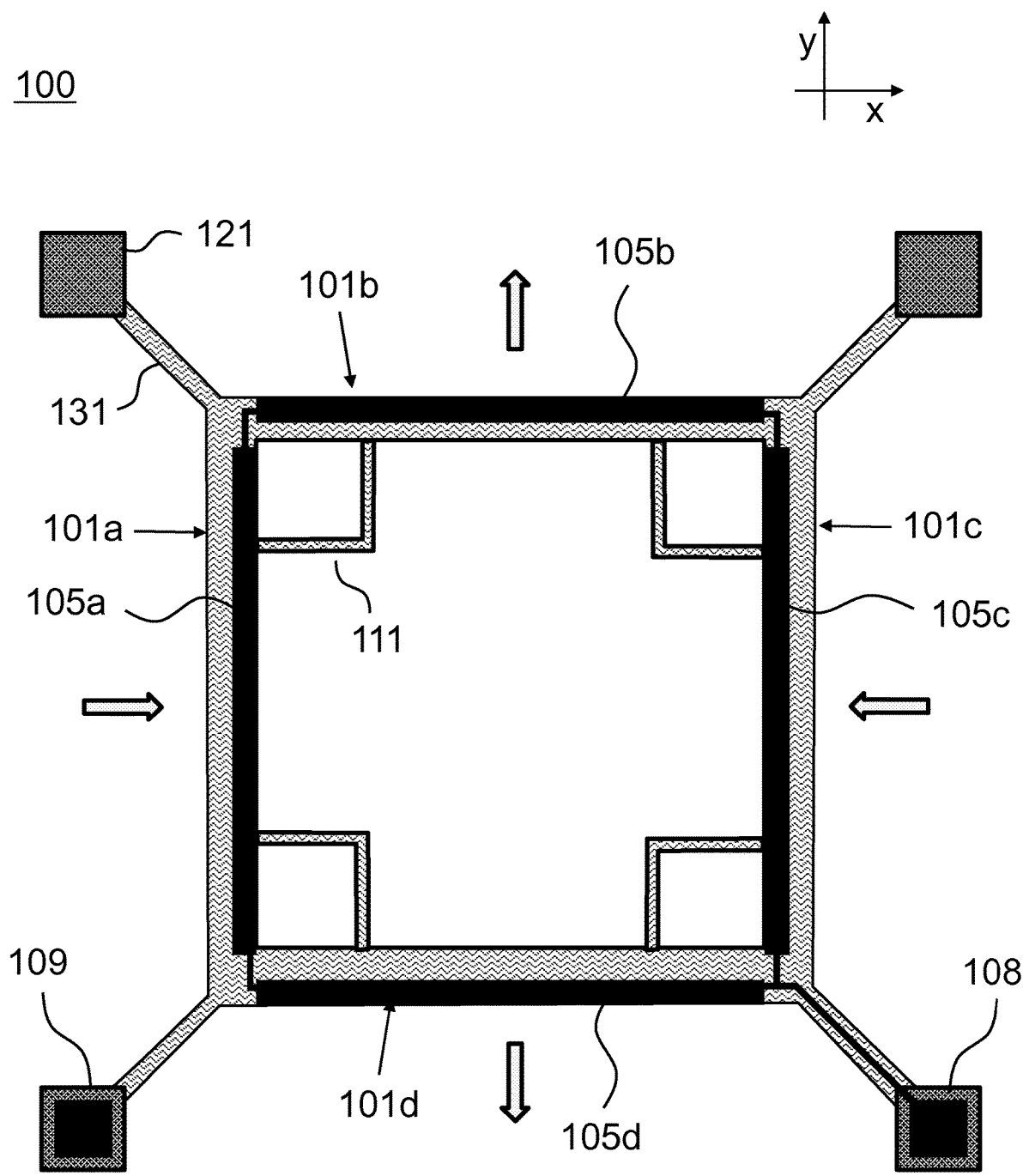
FIG. 12 shows top electrode patterning in accordance with certain embodiments.

In certain embodiments, the resonators of the preceding resonator assemblies are set into vibration by means of piezoelectric coupling (or actuation). FIG. 12 shows top electrode patterning in accordance with certain embodiments corresponding to the resonator assembly shown for example in FIG. 1. A piezoelectric film (for example, an AlN thin film) is deposited on top of a single crystalline silicon layer of the resonator structure. A top electrode is deposited and patterned on the piezoelectric thin film. In certain embodiments, a first part 105a of the top electrode is positioned on the vibrating beam 101a (the vibrating beams 101 have been itemized as vibrating beams 101a-101d in FIG. 12), a second part 105b is positioned on the vibrating beam 101b, a third part 105c is positioned on the vibrating beam 101c, and a fourth part 105d is positioned on the vibrating beam 101d. The material of the electrode may be, for example, Mo, Al, Au, Pt, Ag, polycrystalline silicon or another conducting material.

The doped silicon layer (see FIG. 10, layer L4) acts as the bottom electrode layer, or the materials stack comprises the additional layer (see FIG. 10, layer L3) on the single crystalline silicon layer L4 operating as the bottom electrode.

When an alternating current signal is connected between the top and bottom electrodes, the second arm 101b and fourth arm 101d of the resonator assembly 100 experience a force which is in the opposite phase with respect to forces experienced by the first arm 101a and the third arm 101c of the resonator assembly. Therefore, during the resonance, the second and fourth arms move away from the symmetry center of the resonator assembly 100 while the first and third arms move towards the symmetry center, and vice versa.

This is achieved, in certain embodiments, by patterning the top electrode as depicted in FIG. 12 so that (i) the first and third parts of the top electrode (105a and 105c) are deposited on the respective arms to cover the top surface halves next to the symmetry center of the resonator assembly while the top surface halves further away from the symmetry center remain uncovered, and (ii) the second and fourth parts of the top electrode (105b and 105d) are deposited on their respective arms to cover the top surface halves further away from the symmetry center while the top surface halves next to the symmetry center of the resonator assembly remain uncovered. In some embodiments, this electrode pattern is used to support the vibration mode of a resonator assembly in which the corners undergo a small angular motion about the nodal points (without translational movement) as the resonator assembly vibrates. Such resonator assemblies (or frames 110) have been illustrated in FIGS. 1-4 (assemblies 100, 200, 300, 400), and FIG. 6A (assembly 600).

In certain embodiments, the wiring to the patterned top electrode 105a-105d is arranged from a contact pad 108 (indicated by the reference numeral 1102 for a resonator according to the materials stack of FIG. 11) positioned on one of the mechanical anchors 121 at the corners of the resonator assembly 100. A contact pad 109 (indicated by the reference numeral 1101 for a resonator according to the materials stack of FIG. 11) for the bottom electrode may be positioned on another mechanical corner anchor 121. (The opening 1120 in the piezoelectric layer L2 illustrated in FIG. 11 is not shown in FIG. 12.) (FIG. 12 exaggerates the width of the suspension beams 131 to illustrate details of the top electrode pattern.)

Figure 13:
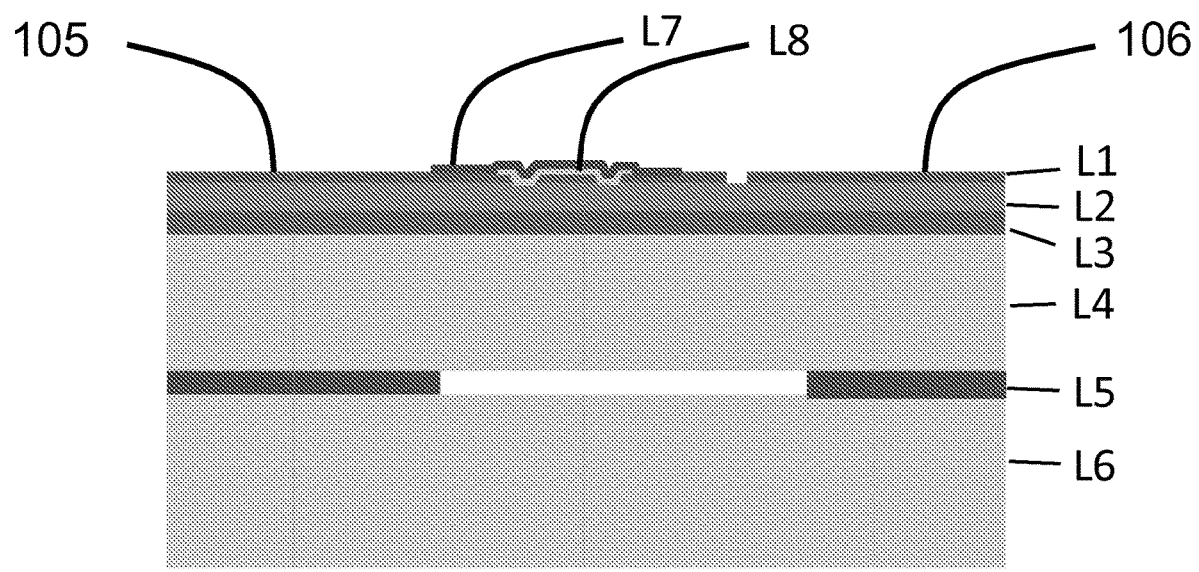
FIG. 13 shows a sectional view of a materials stack of a resonator assembly in accordance with further embodiments.

FIG. 13 shows an alternative cross section of a resonator assembly. The difference to FIG. 11 is that there are two polarities of the top electrode: 105 ($X_{in}$) and 106 ($X_{out}$), and the bottom electrode is floating. The top electrode geometry of two polarities requires a crossing electrode pattern without an electrical connection (see FIG. 14). This is implemented in certain embodiments by adding two material layers: L7=bridge conductor layer, L8=bridge dielectric layer.

Figure 14:
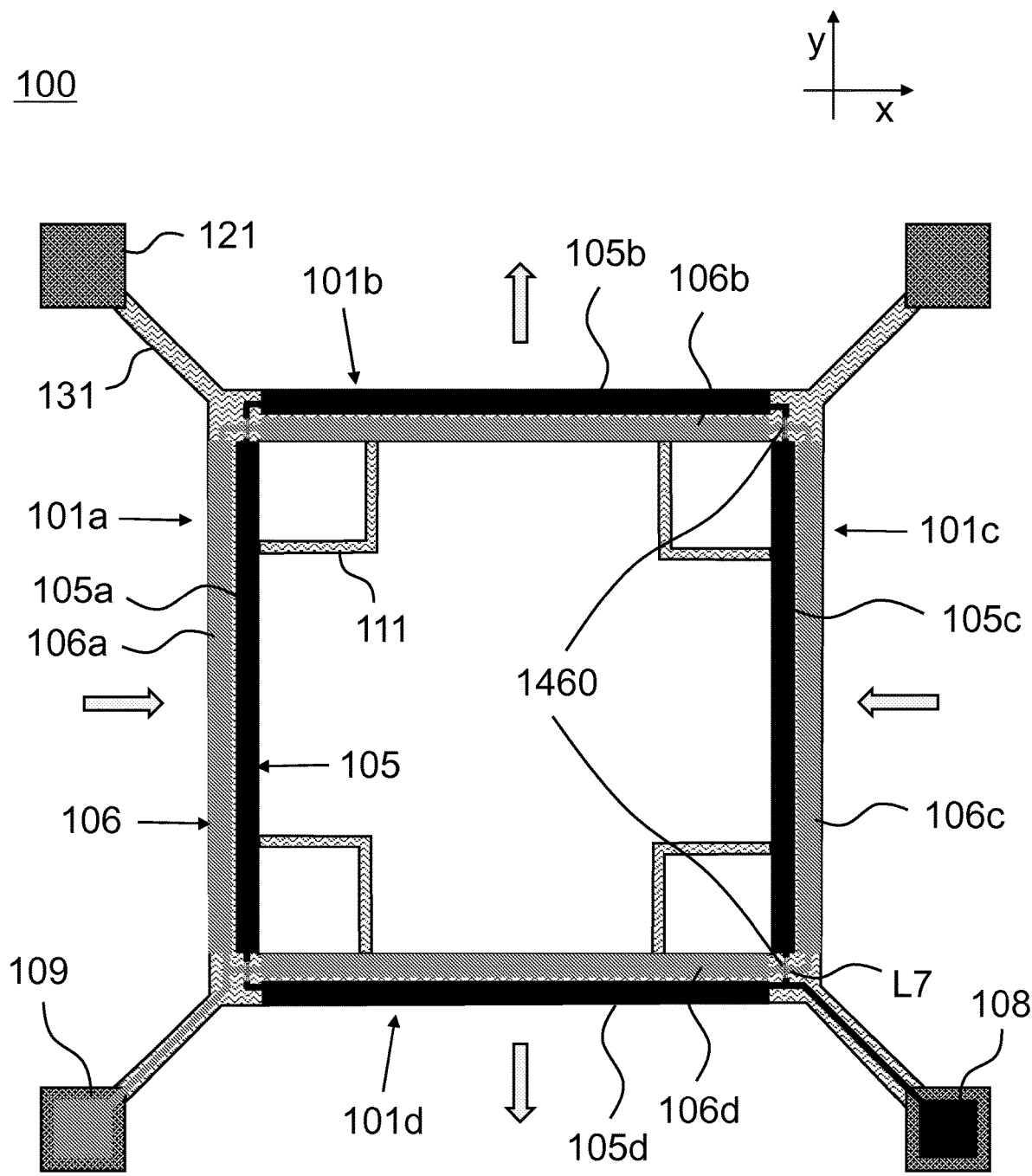
FIG. 14 shows an alternative of top electrode patterning in accordance with certain embodiments.

FIG. 14 shows an example top electrode pattern (with reference to FIG. 13) which may be used in order achieve electromechanical transduction of the square-shaped frame resonator assembly 100 when the top electrode layer has regions of two polarities ($X_{in}$, $X_{out}$). In some embodiments, this electrode pattern is used to support the vibration mode of a resonator assembly in which the corners undergo a small angular motion about the nodal points (without translational movement) as the resonator assembly vibrates. Such resonator assemblies (or frames 110) have been illustrated in FIGS. 1-4 (assemblies 100, 200, 300, 400), and FIG. 6A (assembly 600). The main parts of the top electrode 105 comprise four parts (105a, 105b, 105c, 105d) patterned on the four arms 101a, 101b, 101c, 101d, respectively, and the contact pad 108 to which the electrode 105 is connected. The contact pad 108 is positioned at one of the mechanical anchors 121. Apart from a small electrically insulating gap between the two electrodes 105 and 106, the top electrode 106 covers the top surface halves of the four arms which are not covered by the top electrode 105 (i.e., the parts 106a, 106b, 106c, 106d shown in FIG. 14). Crossing of the traces (or wiring) of different polarities is achieved with using L7 bridge conductor layer and L8 bridge dielectric layer (L8 not shown in FIG. 14). Two of the four crossings which use the bridge conductor are indicated by the reference numeral 1460 in FIG. 14. The contact pad 109 to which the electrode 106 is connected is positioned at another of the mechanical anchors 121.

Referring to the resonator assembly illustrated in FIGS. 13 and 14, and other embodiments discussed below, one of the advantages of driving the resonator (or resonator assembly) using two top electrodes with different polarities and an electrically floating bottom electrode is that the (shunt) capacitance $C_0$ between the electrodes is essentially halved and therefore the figure-of-merit FOM of the resonator is essentially doubled.

Figure 15:
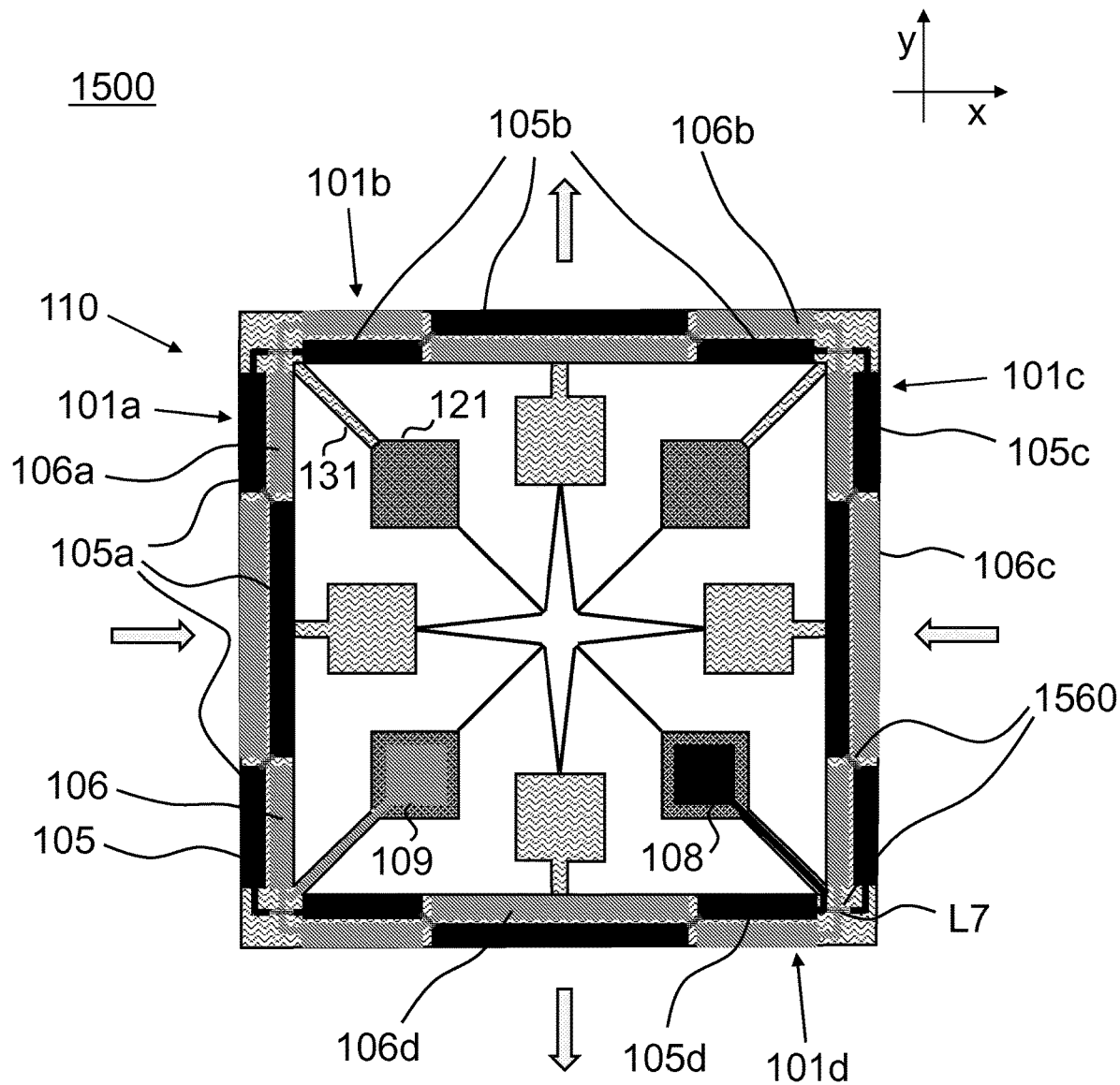
FIG. 15 shows top electrode patterning for the resonator assembly of FIG. 5 in accordance with certain embodiments.

FIG. 15 shows an example of the top electrode pattern (with reference to FIG. 13) which may be used in order to achieve electromechanical transduction of a square-shaped-frame resonator assembly 1500 with rigid corners (meaning that the nodal points at the corners of the frame are suspended so rigidly that they do not experience rotational movement when the square-forming flexural beams are vibrating) and a central star-shaped synchronizing element. The resonator assembly 1500 shown in FIG. 15 corresponds to the resonator assembly 500 of FIG. 5.

The top electrode layer has regions of two polarities ($X_{in}$, $X_{out}$). The top electrode 105 is disposed on the four vibrating arms 101a, 101b, 101c, 101d. The respective electrode areas are denoted as 105a, 105b, 105c, 105d. On the first vibrating beam 101a, the top electrode 105 has been divided into 3 areas 105a. The first and third area cover the outermost (left) half of the first and last quarters of the beam top surface. The second area covers the innermost (right) half of the second and third quarters of the beam top surface. On the neighboring second vibrating beam 101b, the top electrode 105 is also divided into 3 areas 105b but the positions of the innermost and outermost areas are switched. On the third vibrating beam 101c (which is neighboring to the second beam 101b), the top electrode 105 is also divided into 3 areas 105c and the positions of the innermost and outermost areas are switched in comparison to the positions on vibrating arm 101b. Similarly, on the fourth vibrating beam 101d (which resides in between the third beam 101c and the first beam 101a), the top electrode 105 is also divided into 3 areas and the positions of the innermost and outermost areas are switched in comparison to the positions on vibrating arm 101c. Apart from a small electrically insulating gap between the two electrodes 105 and 106, the top electrode 106 covers the top surface halves of the four arms which are not covered by the top electrode 105 (the parts 106a, 106b, 106c, 106d shown in FIG. 53). Crossing of the traces (wiring) of different polarities is achieved with using L7 bridge conductor layer and L8 bridge dielectric layer (L8 not shown in FIG. 15). Two crossings which use the bridge conductor are indicated by the reference number 1560 in FIG. 15.

The electrode 105 is connected to the contact pad 108 positioned at one of the mechanical anchors 121. The electrode 106 is connected to the contact pad 109 positioned at another of the mechanical anchors 121.

Figure 16:
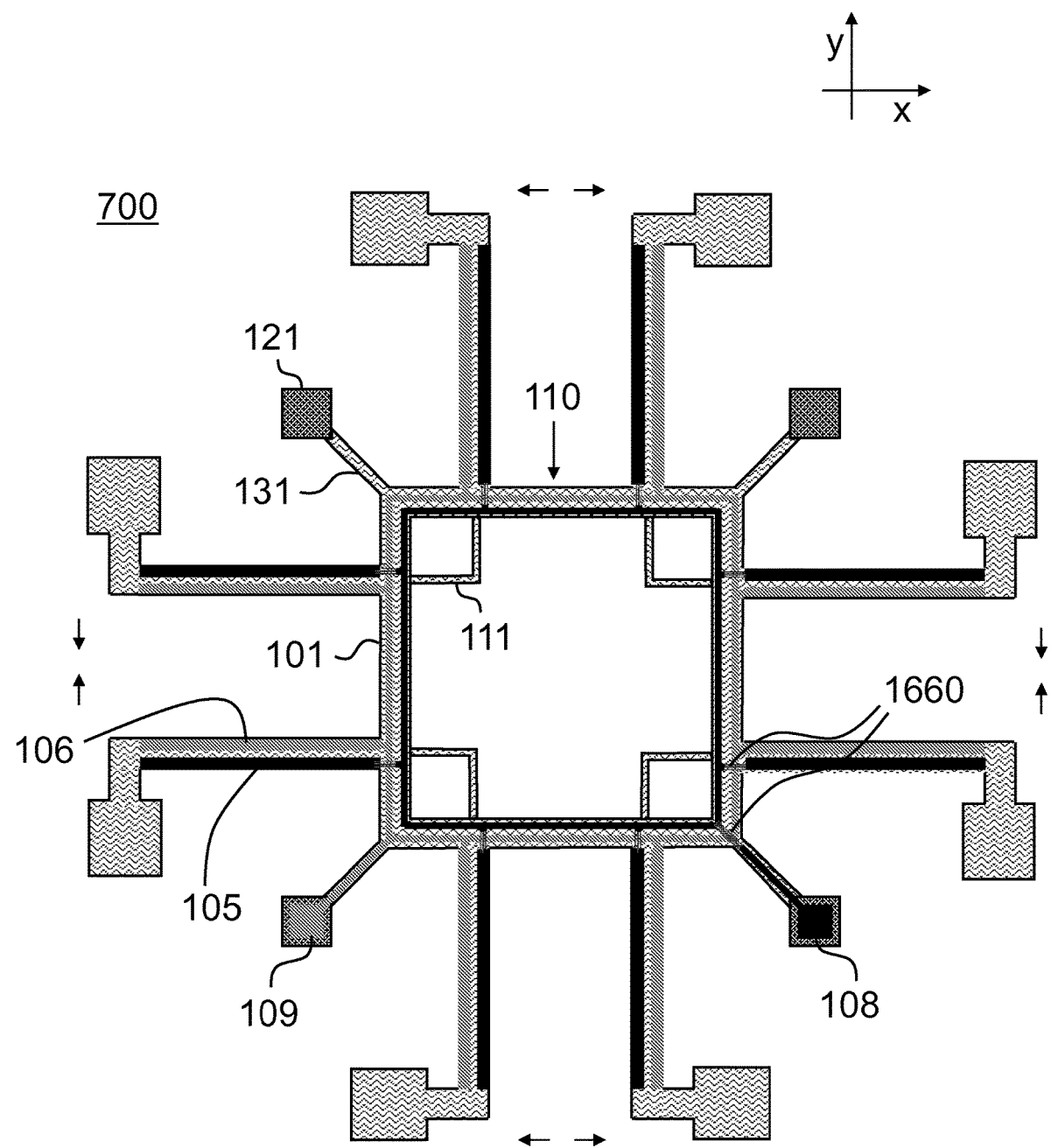
FIG. 16 shows top electrode patterning for the resonator assembly of FIGS. 7 and 8 in accordance with certain embodiments.

FIG. 16 shows an example of the top electrode pattern (with reference to FIG. 13) which may be used in order to achieve electromechanical transduction of an assembly of flexural beam-mass resonators which vibrate in a single collective mode through the synchronizing action of the central square-shaped element 110, as illustrated in FIG. 7 and FIG. 8. Also in this embodiment, the top electrode layer has regions of two polarities ($X_{in}$, $X_{out}$), and the bottom electrode (denoted by L3 in FIG. 13) is electrically floating. The top electrode 105 is disposed on the top surfaces of the eight vibrating arms of the resonator assembly 700 in a way illustrated in FIG. 16. Attached to each four sides of the central square-shaped element 110, there is a beam-mass resonator pair. The top-surface halves of the two beams of the beam-mass resonator pairs are covered with electrode areas, one connected to the top electrode 105 and the other connected to the top electrode 106, and an electrically insulating area separates the two halves. For each beam-mass resonator pair, the electrode areas of the central halves are parts of the same top electrode structure (either 105 or 106), and the outermost halves are parts of the other top electrode structure. When comparing any two beam-mass resonator pairs aligned orthogonally to each other, the relative positions of the two electrodes halves are interchanged. When comparing any two beam-mass resonator pairs aligned parallelly, the relative positions of the two electrodes halves are the same. As a result of the top-electrode pattern, the vibrational motion is such that members of the flexural beam-mass resonator pairs move in antiphase with respect to each other, and the beam-mass pairs opposite to each other undergo motion in the same phase whereas beam-mass pairs in the orthogonally aligned edges move in antiphase. Such a motion is illustrated by the small arrows in FIG. 16. Crossing of the traces (wiring) of different polarities is achieved with using L7 bridge conductor layer and L8 bridge dielectric layer (not shown in FIG. 16). Two crossings which use the bridge conductor are indicated by the reference number 1660 in FIG. 16.

The electrode 105 is connected to the contact pad 108 positioned at one of the mechanical anchors 121. The electrode 106 is connected to the contact pad 109 positioned at another of the mechanical anchors 121. (FIG. 16 exaggerates the width of the suspension beams 131 to illustrate details of the top electrode pattern.)

Figure 17:
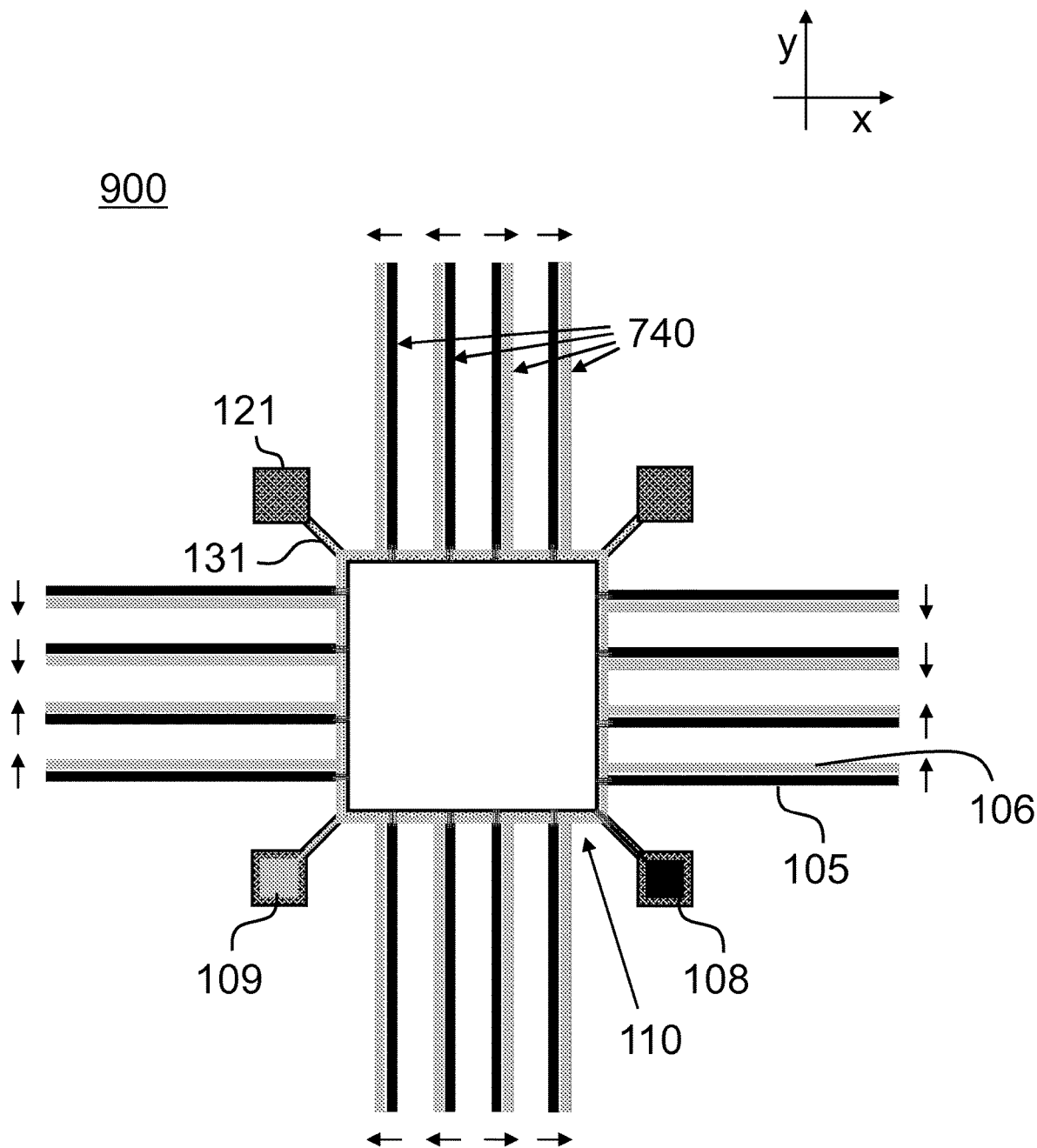
FIG. 17 shows top electrode patterning for the resonator assembly of FIG. 9 in accordance with certain embodiments.

FIG. 17 shows an example of the top electrode pattern (with reference to FIG. 13) which may be used in order achieve electromechanical transduction of an assembly of 16 flexural-beam resonators illustrated in FIG. 9. The beam resonators of the resonator assembly 900 vibrate in a single collective mode through the synchronizing action of the central frame 110. Also in this embodiment, the top electrode layer has regions of two polarities ($X_{in}$, $X_{out}$), and the bottom electrode (denoted by L3 in FIG. 13) is electrically floating. The top electrodes 105 and 106 are disposed on the top surfaces of the 16 vibrating arms in a way illustrated in FIG. 17, following the methodology represented in the previous examples. As a result, electromechanical coupling is such that it effectively couples to the resonance mode illustrated by the small arrows in FIG. 17. Crossing of the traces (wiring) of different polarities is achieved with using L7 bridge conductor layer and L8 bridge dielectric layer (not shown in FIG. 17).

The electrode 105 is connected to the contact pad 108 positioned at one of the mechanical anchors 121. The electrode 106 is connected to the contact pad 109 positioned at another of the mechanical anchors 121. (FIG. 17 exaggerates the width of the suspension beams 131 to illustrate details of the top electrode pattern.)

Figure 18:
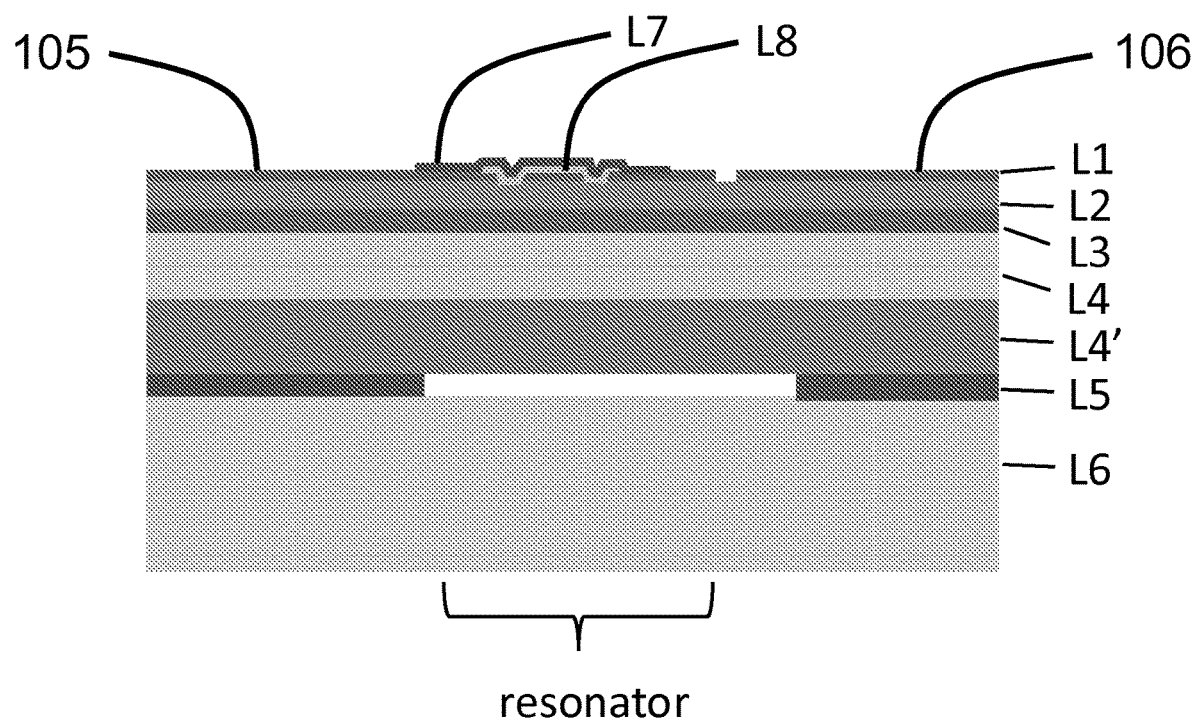
FIGS. 18-20 show sectional views of materials stacks of resonator assemblies in accordance with yet further embodiments.

FIG. 18 shows a sectional view of a silicon MEMS resonator assembly in accordance with yet other embodiments. In these embodiments, a thermal oxide layer L4' is provided. The thermal oxide layer, for example, a silicon oxide $SiO_2$ layer is positioned next (beneath or above) to the (degeneratively) doped silicon layer L4 or on both sides of the layer L4. In yet further embodiments the silicon oxide $SiO_2$ layer is positioned in the middle of the layer L4 so that the $SiO_2$ layer divides the L4 layer into two parts. The thermal oxide layer L4' is to improve thermal properties of the resonator. In certain embodiments, the linear temperature coefficient (of frequency) TCF1 of the resonator is modified (e.g., increased) by adding the thermal oxide layer. For example, it may be that a resonator without the thermal oxide layer has a slightly negative TCF1 (for example −5 ppm/° C.). By adding a thermal oxide layer with an appropriate thickness, which depends on the embodiment, the TCF1 is increased. The desired TCF1=0 can be achieved.

Figure 19:
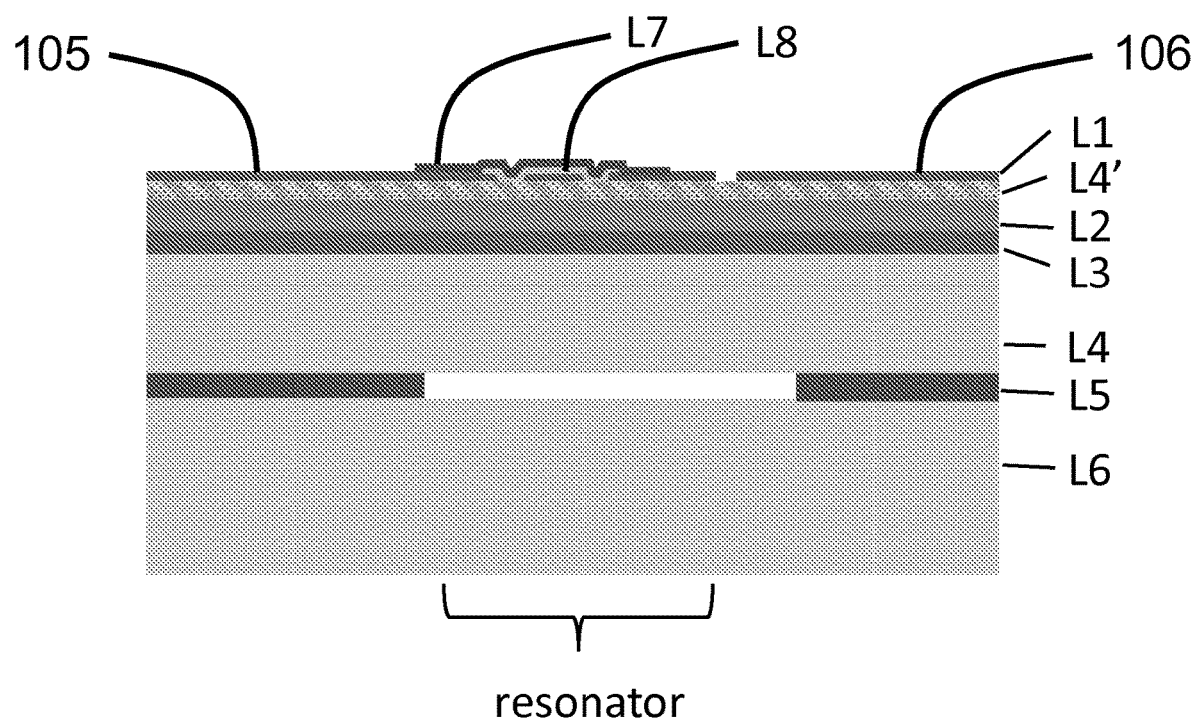
Figure 20:
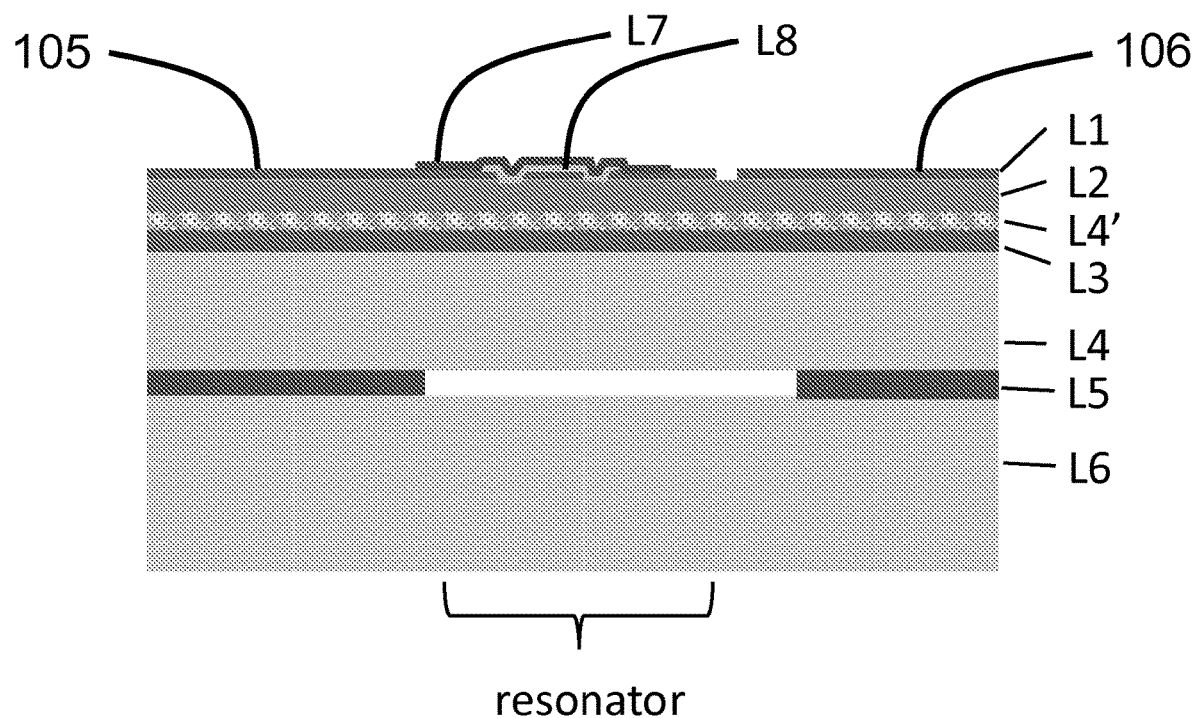

FIGS. 19 and 20 show sectional views of silicon MEMS resonator assemblies in accordance with yet further embodiments. In these embodiments, a silicon oxide ($SiO_2$) layer L4' is deposited either on the piezoelectric layer L2, as illustrated in FIG. 19 (i.e., in between layers L1 and L2), or below the piezoelectric layer, as illustrated in FIG. 20 (i.e., in between L2 and the bottom electrode layer L3). As to the other materials layers, a reference is made to the explanation of FIG. 11, FIG. 13 and FIG. 18. In certain embodiments, as discussed above with reference to FIG. 11, it is possible that the doped silicon layer L4 acts as the bottom electrode layer, i.e., layers L3 and L4 may be combined into a single silicon layer.

The advantage of these solutions can be understood by considering the following reasoning. To achieve a reduction in the ESR of the resonator it is advantageous to scale down the mass of the resonator by reducing film thicknesses while maintaining the condition that the overall TCF1 of the materials stack be zero. Silicon oxide has a relatively high positive temperature coefficient, higher than that of strongly phosphorus-doped silicon, and it is therefore possible to reduce the resonator materials stack overall thickness (and mass) by replacing a portion of the doped silicon by silicon oxide while keeping the overall TCF1=0. The result of reducing the thickness is that ESR decreases and, in the same time, the capacitance across piezoelectric layer increases. To prevent the capacitance from increasing too much, it is advantageous to place the silicon oxide layer L4' between the bottom and top electrodes as illustrated in FIG. 19 and FIG. 20.

There are several well know methods to grow silicon oxide layers such as thermal oxidation of silicon, plasma-enhanced chemical vapor deposition (PECVD) or low temperature oxide (LTO) methods. For example, PECVD and LTO methods can be used to grow the $SiO_2$ layers for resonators according to the materials stack of FIGS. 19 and 20.

In certain embodiments, the bottom electrode layer L3 and the doped silicon layer L4 are combined into a single doped silicon layer L4. In such a case thermal oxide can be conveniently formed from the layer L4 by thermal oxidation thereby forming the layer L4' on top of the remaining layer L4.

In some embodiments, the disclosed silicon MEMS resonator assemblies are fabricated on a cavity-SOI wafer (the so-called CSOI wafer). Manufacturing steps for fabricating resonators on both SOI and CSOI wafer substrates are known as such.

Although the embodiments described above concentrate on piezoelectrically coupled (or actuated) MEMS resonators the same ideas can be extended to resonators using other transduction mechanisms such as electrostatic, magnetic, piezoresistive, and thermal mechanisms and their combinations.

Without limiting the scope and interpretation of the patent claims, certain technical effects of one or more of the example embodiments disclosed herein are listed in the following. A technical effect is good frequency stability over a wide temperature range. A further technical effect is a low equivalent series resistance (ESR) and a high quality factor. A further technical effect is providing a resonator with a small footprint.

The foregoing description has provided by way of non-limiting examples of particular implementations and embodiments of the present disclosure a full and informative description of the best mode presently contemplated by the inventors for carrying out the disclosed embodiments. It is however clear to a person skilled in the art that the disclosed embodiments are not restricted to details of the embodiments presented above, but that it can be implemented in other embodiments using equivalent means without deviating from the characteristics of the disclosed embodiments.

Furthermore, some of the features of the above-disclosed embodiments of this present disclosure may be used to advantage without the corresponding use of other features. As such, the foregoing description should be considered as merely illustrative of the principles of the present disclosure, and not in limitation thereof. Hence, the scope of the disclosed embodiments is only restricted by the appended patent claims.

The invention claimed is:

1. A silicon microelectromechanical system, MEMS, resonator assembly, comprising:
    four flexural beam elements forming a rectangular frame, each beam element being connected at an end thereof to an end of a neighboring one of the beam elements, the resonator assembly further comprising:
    connection elements for connecting the rectangular frame to at least one mechanical anchor, and the resonator assembly supporting an in-plane flexural collective resonance mode, and
    a meander spring element connecting a respective flexural beam element to its respective mass element.

2. The silicon MEMS resonator assembly of claim 1, further comprising coupling elements to mechanically couple adjacent beam elements.

3. The silicon MEMS resonator assembly of claim 1, wherein each flexural beam element has an additional mass element on the inner side of the frame.

4. The silicon MEMS resonator assembly of claim 1, wherein each meander spring element is formed of elongated mass portions, aligned parallelly with one of the flexural beam elements of the said rectangular frame.

5. The silicon MEMS resonator assembly of claim 1, comprising a central synchronizing element inside of the rectangular frame.

6. The silicon MEMS resonator assembly of claim 1, comprising a plurality of flexural beam resonators or flexural beam-mass resonators that outwardly protrude from the rectangular frame.

7. The silicon MEMS resonator assembly of claim 1, wherein the form of the rectangular frame is a square.

8. The silicon MEMS resonator assembly of claim 1, wherein there is variation in a width of adjacent flexural beam elements of the frame.

9. The silicon MEMS resonator assembly of claim 1, wherein each flexural beam element is aligned along a <100>crystalline direction of single crystalline silicon or deviates at most 15 degrees from such a direction.

10. The silicon MEMS resonator assembly of claim 1, where a first part of a flexural beam element resides in a degeneratively doped silicon layer and a second part of the flexural beam element resides in a $SiO_2$ layer formed beneath or above or on both sides of the degeneratively doped silicon layer.

11. The silicon MEMS resonator assembly of claim 1, comprising:
    a piezoelectric layer for piezoelectric actuation of the collective resonance mode.

12. The silicon MEMS resonator assembly of claim 11, comprising a top electrode and a bottom electrode for the piezoelectric actuation.

13. The silicon MEMS resonator assembly of claim 11, comprising two top electrodes for the piezoelectric actuation.

14. The silicon MEMS resonator assembly of claim 1, comprising a degeneratively doped single crystalline silicon body.

15. The silicon MEMS resonator assembly of claim 1 configured to operate at 32 kHz frequency band.

16. Use of the frame of claim 1 to synchronize flexural beam or beam-mass resonators into a single collective resonance mode.

* * * * *